(12) United States Patent
Champion

(10) Patent No.: US 6,765,579 B2
(45) Date of Patent: Jul. 20, 2004

(54) PIXEL PAGES USING COMBINED ADDRESSING

(75) Inventor: Mark Champion, Kenmore, WA (US)

(73) Assignees: Sony Corporation, Tokyo (JP); Sony Electronics Inc., Park Ridge, NJ (US)

(*) Notice: Subject to any disclaimer, the term of this patent is extended or adjusted under 35 U.S.C. 154(b) by 188 days.

(21) Appl. No.: 10/075,678

(22) Filed: Feb. 13, 2002

(65) Prior Publication Data

US 2002/0130876 A1 Sep. 19, 2002

Related U.S. Application Data

(60) Provisional application No. 60/324,498, filed on Sep. 24, 2001, provisional application No. 60/269,784, filed on Feb. 15, 2001, and provisional application No. 60/269,783, filed on Feb. 15, 2001.

(51) Int. Cl.[7] .................................................. G09G 5/39
(52) U.S. Cl. ....................... 345/531; 345/536; 345/545; 345/565
(58) Field of Search ................................ 345/531, 536, 345/539, 545, 546, 565

(56) References Cited

U.S. PATENT DOCUMENTS 4,449,199 A 5/1984 Daigle
5,142,276 A 8/1992 Moffat (List continued on next page.)

OTHER PUBLICATIONS

Lieberman, David; Sony champions MEMS display technology; EE Times, Jul. 14, 2000; http://www.eetimes.com/story/OEG20000714S0004.

(List continued on next page.)

Primary Examiner—Matthew C. Bella
Assistant Examiner—Mackly Monestime
(74) Attorney, Agent, or Firm—Thomas F. Lebens; Fitch, Even, Tabin & Flannery

(57) ABSTRACT

Methods and apparatus for implementing a pixel page system providing pixel pages using combined addressing. In alternative implementations, the system stores and retrieves data other than pixel data. In one implementation, a pixel page system includes: a data source, providing pixel data for pixels in a first order, where each pixel is in a frame of pixels, the frame having horizontal rows of pixels, vertical columns of pixels, a first section of pixels, and a second section of pixels; a data destination, receiving pixel data for pixels in a second order; at least one memory device, each memory device having a plurality of memory pages including a plurality of memory locations divided between a first memory page section and a second memory page section, each memory location having an address; and where pixel data for each pixel corresponds to an entry in one of a plurality of pixel pages, each pixel page having a plurality of pixel page rows each including a plurality of pixels and a plurality of pixel page columns each including a plurality of pixels, and each pixel page corresponds to a respective memory page, and pixels in the first section of pixels are in a first pixel page section and pixels in the second section of pixels are in a second pixel page section, where pixel data is stored to the memory device in the first order and retrieved from the memory device in the second order, and where each memory page stores pixel data in multiple locations according to the first order and stores pixel data in multiple locations according to the second order, where pixel data for pixels in the first pixel page section is stored in memory pages in the first memory page section and pixel data for pixels in the second pixel page section is stored in memory pages in the second memory page section, where at least two consecutive memory pages in the first memory page section are not contiguous, and at least two consecutive memory pages in the second memory page section are not contiguous.

24 Claims, 19 Drawing Sheets

U.S. PATENT DOCUMENTS

| | | | |
|---|---|---|---|
| 5,195,182 A | | 3/1993 | Sasson |
| 5,303,341 A | * | 4/1994 | Rivshin .................... 358/1.17 |
| 5,479,605 A | * | 12/1995 | Saitoh ........................ 345/561 |
| 5,559,953 A | | 9/1996 | Seiler et al. |
| 5,561,777 A | | 10/1996 | Kao et al. |
| 5,579,473 A | | 11/1996 | Schlapp et al. |
| 5,606,650 A | | 2/1997 | Kelley et al. |
| 5,619,471 A | | 4/1997 | Nunziata |
| 5,633,726 A | | 5/1997 | Timmermans |
| 5,781,201 A | | 7/1998 | McCormack et al. |
| 5,794,016 A | | 8/1998 | Kelleher |
| 5,798,843 A | * | 8/1998 | Yamamoto et al. ......... 358/404 |
| 5,815,167 A | | 9/1998 | Muthal et al. |
| 5,815,169 A | | 9/1998 | Oda |
| 5,924,111 A | | 7/1999 | Huang et al. |
| 5,933,154 A | | 8/1999 | Howard et al. |
| 6,005,592 A | | 12/1999 | Koizumi et al. |
| 6,031,638 A | | 2/2000 | Rao et al. |
| 6,111,992 A | | 8/2000 | Likhterov et al. |
| 6,177,922 B1 | * | 1/2001 | Schiefer et al. ............. 345/698 |
| 6,226,709 B1 | | 5/2001 | Goodwin et al. |
| 6,259,459 B1 | | 7/2001 | Middleton |
| 6,278,645 B1 | | 8/2001 | Buckelew et al. |
| 6,301,649 B1 | | 10/2001 | Takasugi |
| 6,331,854 B1 | | 12/2001 | Rogers et al. |
| 6,347,344 B1 | | 2/2002 | Baker et al. |
| 6,417,867 B1 | | 7/2002 | Hallberg |
| 6,496,192 B1 | | 12/2002 | Shreesha et al. |
| 6,549,207 B1 | | 4/2003 | Matsumoto |
| 6,567,531 B1 | | 5/2003 | Kondo et al. |
| 6,587,112 B1 | | 7/2003 | Goeltzenleuchter et al. |
| 2002/0109689 A1 | | 8/2002 | Champion |
| 2002/0109690 A1 | | 8/2002 | Champion |
| 2002/0109691 A1 | | 8/2002 | Champion |
| 2002/0109692 A1 | | 8/2002 | Champion |
| 2002/0109693 A1 | | 8/2002 | Champion |
| 2002/0109694 A1 | | 8/2002 | Champion |
| 2002/0109695 A1 | | 8/2002 | Champion |
| 2002/0109696 A1 | | 8/2002 | Champion |
| 2002/0109698 A1 | | 8/2002 | Champion |
| 2002/0109699 A1 | | 8/2002 | Champion |
| 2002/0109791 A1 | | 8/2002 | Champion |
| 2002/0109792 A1 | | 8/2002 | Champion |
| 2002/0110030 A1 | | 8/2002 | Champion |
| 2002/0110351 A1 | | 8/2002 | Champion |
| 2002/0113904 A1 | | 8/2002 | Champion |
| 2002/0149596 A1 | | 10/2002 | Champion |
| 2003/0058368 A1 | | 3/2003 | Champion |
| 2003/0151609 A1 | | 8/2003 | Champion |

OTHER PUBLICATIONS

*SMPTE Standard for Television 1920 x 1080 Scanning and Analog and Parallel Digital Interfaces for Multiple Picture Rates*; SMPTE 274–1998; Copyright 1998; pp. 1–24; Revision of ANSI/SMPTE 274M–1995; The Society of Motion Picture and Television Engineers; White Plains, New York.

Bloom, D.M.; *The Grating Light Valve: revolutionizing display technology*; pp. 1–10; Silicon Light Machines (formerly Echelle, Inc.).

Corrigan, R.W., et al.; *An Alternative Architecture for High Performance Display*; Presented at the 141$^{st}$ SMPTE Technical Conference and Exhibition; Nov. 20, 1999, New York, New York; pp. 1–5; Silicon Machines, Sunnyvale, CA.

Hearn, D., et al.; *Computer Graphics C Version* [2d Ed.]; pp. 53–56; Prentice Hall, Upper Saddle River, New Jersey.

McCarron, D., et al.; Accelerating PC Graphics, Emerging Technologies Edition, Market Strategy and Forecast Report; 1995; pp. 2–49 through 2–93, 2–159 (labeled as pp. 1–46); Mercury Research.

* cited by examiner

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |

350 FIG. 3B
(Prior Art)

| 0 | 2 | 4 | 6 |
|---|---|---|---|
| 8 | 10 | 12 | 14 |
| 16 | 18 | 20 | 22 |
| 24 | 26 | 28 | 30 |

FIG. 3C 375
(Prior Art)

| 1 | 3 | 5 | 7 |
|---|---|---|---|
| 9 | 11 | 13 | 15 |
| 17 | 19 | 21 | 23 |
| 25 | 27 | 29 | 31 |

|   710 |     | 715 |     |     |     |     |     |     |     |     |     | 705 |     |     |     |
|---|---|---|---|---|---|---|---|---|---|---|---|---|---|---|---|
|   | 720 |     |     |     |     |     |     |     |     |     |     |     |     |     |     |
| 725 → | 0 | 1 | 2 | 3 | 4 | 5 | 6 | 7 | 8 | 9 | 10 | 11 | 12 | 13 | 14 | 15 |
| | 16 | 17 | 18 | 19 | 20 | 21 | 22 | 23 | 24 | 25 | 26 | 27 | 28 | 29 | 30 | 31 |
| | 32 | 33 | 34 | 35 | 36 | 37 | 38 | 39 | 40 | 41 | 42 | 43 | 44 | 45 | 46 | 47 |
| | 48 | 49 | 50 | 51 | 52 | 53 | 54 | 55 | 56 | 57 | 58 | 59 | 60 | 61 | 62 | 63 |
| | 64 | 65 | 66 | 67 | 68 | 69 | 70 | 71 | 72 | 73 | 74 | 75 | 76 | 77 | 78 | 79 |
| | 80 | 81 | 82 | 83 | 84 | 85 | 86 | 87 | 88 | 89 | 90 | 91 | 92 | 93 | 94 | 95 |
| | 96 | 97 | 98 | 99 | 100 | 101 | 102 | 103 | 104 | 105 | 106 | 107 | 108 | 109 | 110 | 111 |
| | 112 | 113 | 114 | 115 | 116 | 117 | 118 | 119 | 120 | 121 | 122 | 123 | 124 | 125 | 126 | 127 |
| | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 |
| | 160 | 161 | 162 | 163 | 164 | 165 | 166 | 167 | 168 | 169 | 170 | 171 | 172 | 173 | 174 | 175 |
| | 176 | 177 | 178 | 179 | 180 | 181 | 182 | 183 | 184 | 185 | 186 | 187 | 188 | 189 | 190 | 191 |
| | 192 | 193 | 194 | 195 | 196 | 197 | 198 | 199 | 200 | 201 | 202 | 203 | 204 | 205 | 206 | 207 |
| | 208 | 209 | 210 | 211 | 212 | 213 | 214 | 215 | 216 | 217 | 218 | 219 | 220 | 221 | 222 | 223 |
| | 224 | 225 | 226 | 227 | 228 | 229 | 230 | 231 | 232 | 233 | 234 | 235 | 236 | 237 | 238 | 239 |
| | 240 | 241 | 242 | 243 | 244 | 245 | 246 | 247 | 248 | 249 | 250 | 251 | 252 | 253 | 254 | 255 |

Fig. 7

| | 0 | 1 | 2 | ... | ... | ... | ... | ... | ... | 15 |
|---|---|---|---|---|---|---|---|---|---|---|
| 0 | 0 | 1 | 2 | ... | ... | ... | ... | ... | ... | 15 |
| 1 | 1920 | 1921 | 1922 | ... | ... | ... | ... | ... | ... | 1935 |
| 2 | 3840 | 3841 | 3842 | ... | ... | ... | ... | ... | ... | 3855 |
| ... | ... | ... | ... | ... | ... | ... | ... | ... | ... | ... |
| 15 | 28800 | 28801 | 28802 | ... | ... | ... | ... | ... | ... | 28815 |

| Pixel | Frame Row | Frame Column | Pixel Page | Pixel Page Row | Pixel Page Column | Memory Page | Memory Address |
|---|---|---|---|---|---|---|---|
| 0 | 0 | 0 | 0 | 0 | 0 | 0 | 0 |
| 1 | 0 | 1 | 0 | 0 | 1 | 0 | 1 |
| 15 | 0 | 15 | 0 | 0 | 15 | 0 | 15 |
| 16 | 0 | 16 | 1 | 0 | 0 | 1 | 256 |
| 1919 | 0 | 1919 | 119 | 0 | 15 | 119 | 30479 |
| 1920 | 1 | 0 | 0 | 1 | 0 | 0 | 16 |
| 1936 | 1 | 16 | 1 | 1 | 0 | 1 | 272 |
| 28815 | 15 | 15 | 0 | 15 | 15 | 0 | 255 |
| 30719 | 15 | 1919 | 119 | 15 | 15 | 119 | 30719 |
| 30720 | 16 | 0 | 120 | 0 | 0 | 128 | 32768 |
| 1964160 | 1023 | 0 | 7560 | 0 | 0 | 8064 | 2064128 |
| 1966079 | 1023 | 1919 | 7679 | 15 | 15 | 8183 | 2226047 |
| 1966080 | 1024 | 0 | 7680 | 0 | 0 | 120 | 30720 |
| 1966081 | 1024 | 1 | 7680 | 0 | 1 | 120 | 30721 |
| 1966208 | 1024 | 128 | 7688 | 0 | 0 | 248 | 63488 |
| 1996800 | 1040 | 0 | 7800 | 0 | 0 | 2040 | 522240 |
| 2071680 | 1079 | 0 | 8040 | 0 | 0 | 5760 | 1474560 |
| 2073599 | 1079 | 1919 | 8159 | 7 | 15 | 7679 | 1965951 |

Fig. 10

PIXEL PAGES USING COMBINED ADDRESSING

RELATED APPLICATIONS

This application claims the benefit of U.S. Provisional Application No. 60/269,784 filed Feb. 15, 2001, of U.S. Provisional Application No. 60/269,783 filed Feb. 15, 2001, and of U.S. Provisional Application No. 60/324,498 filed Sep. 24, 2001, the disclosures of which are incorporated herein by reference.

This application is related to the following co-pending and commonly assigned patent applications: application Ser. No. 09/908,295 (filed on Jul. 17, 2001); application Ser. No. 09/907,852 (filed on Jul. 17, 2001); application Ser. No. 09/907,854 (filed on Jul. 17, 2001); application Ser. No. 09/908,301 (filed on Jul. 17, 2001); application Ser. No. 10/051,538 filed Jan. 16, 2002; application Ser. No. 10/051,680 (filed Jan. 16, 2002); application Ser. No. 10/052,074 (filed Jan. 16, 2002); and application Ser. No. 10/051,541 (filed Jan. 16, 2002), the disclosures of which are incorporated herein by reference.

BACKGROUND

The present invention is related to video data storage. More particularly, the present invention is related to video display systems and frame buffers. Several related technologies are discussed below (in labeled sections for clarity).

1. Raster Scan Displays

A common type of graphics monitor is a conventional raster-scan display using a cathode ray tube ("CRT"). As is well known, in a typical CRT, an electron beam strikes phosphor on the inner surface of the screen producing light visible on the outer surface of the screen. By controlling the electron beam different locations of the screen can be struck, creating a pattern and hence a video image. In a typical CRT raster-scan display, the screen area is divided into a grid of pixels (or picture elements). The electron beam sweeps from left to right across the screen, one row at a time from top to bottom, progressively drawing each pixel on the screen. Each row of pixels is commonly referred to as a scan line. In this type of conventional display, the scan lines are horizontal. The number of pixels in a single scan line is referred to as the width. One complete pass over the screen and the pixels in that pass are commonly referred to as a frame. As the electron beam moves across the pixels of each scan line, the beam intensity can be adjusted to vary the light produced by the screen phosphor corresponding to the pixels. The light emitted by the phosphor of the pixels creates a pattern of illuminated spots forming the video image. The intensity of the electron beam is controlled by image data stored in a section of memory called the frame buffer or refresh buffer.

2. Grating Light Valves

Another type of display system uses one or more grating light valves ("GLV") to produce an image. GLV's are known devices, and a description can be found in (among other sources) a paper by D. M. Bloom of Silicon Light Machines, Inc., titled "The Grating Light Valve: revolutionizing display technology" (1997; available from Silicon Light Machines; and a copy of which has been filed in an Information Disclosure Statement for this application), and in an article (and therein cited references) by R. W. Corrigan and others of Silicon Light Machines, Inc., titled "An Alternative Architecture for High Performance Display" (presented at the 141$^{st}$ SMPTE Technical Conference and Exhibition, Nov. 20, 1999, in New York, N.Y.), the disclosures of which are incorporated herein by reference. In overview, a GLV uses a combination of reflection and diffraction of light to create an image. A GLV includes a one-dimensional array of GLV pixels, each GLV pixel including a number of microscopic "ribbons." The ribbons for each GLV pixel can be deflected through electrostatic force to create an adjustable diffraction grating. In a non-deflected state, the ribbons reflect light. As the ribbons are deflected, the ribbons increasingly diffract light. Accordingly, by controlling the ribbons, the proportion of light that is either reflected or diffracted can be controlled for each GLV pixel. The GLV deflects the ribbons for each GLV pixel according to image data, such as pixel data received from a frame buffer.

An array of GLV pixels can create a column of visible pixels, such as 1088 pixels, typically an entire column at a time. A GLV can be used to create a vertical column of pixels in a high definition resolution image, such as a screen resolution of 1920 pixels horizontally by 1080 pixels vertically (with some of the 1088 pixels left blank or dark). By providing a GLV with pixel data representing columns of pixels in a frame, the GLV can create the frame of pixels, one column at a time, sweeping from left to right. The location of each column of pixels can be controlled external to the GLV array, such as through lenses and an adjustable mirror, rather than moving the GLV itself. A combination of three GLV's for red, green, and blue can be used to produce a color image.

3. Frame Buffers

FIG. 1A is a representation of a screen 105 as a grid of pixels 110. In FIG. 1A, for simplicity, screen 105 is only 4×4 and so only 16 pixels are shown, but a typical screen has many more pixels. One common screen resolution is high definition ("HD") resolution, where screen resolution indicates the number of pixels in a frame and is typically given as the horizontal resolution (number of pixels in one row) versus the vertical resolution (number of pixels in one column). HD resolution is either 1920×1080 (2,073,600 total pixels per frame) or 1280×720 (921,600 pixels per frame). Herein, HD resolution refers to 1920×1080.

Returning to FIG. 1A, the pixels 110 are often numbered sequentially for reference. Pixel 0 is typically at the upper left. FIG. 1B is a representation of a memory device 150 implementing a frame buffer as a grid of memory locations 155. Typical memory devices include SDRAM (synchronous dynamic random access memory). The actual memory device used may vary in different devices, but the memory locations for the frame buffer are typically in a contiguous block of locations with sequential addresses. Memory device 150 has a memory location 155 for storing pixel data (e.g., an intensity value) for each pixel 110 of screen 105. In some implementations, pixel data for more than one pixel is stored at each memory location. In many conventional raster-scan systems, pixel data is stored in memory locations adjacent to one another in the same pattern as the pixels on the screen. In FIG. 1B, each memory location 155 is numbered with the number of the pixel (110 from FIG. 1A) corresponding to the pixel data stored in that memory location 155. For example, the pixel at the upper left of the screen is pixel 0 in FIG. 1A and pixel data for pixel 0 is stored in the first memory location in memory device 150, as indicated by the "0" in the upper left memory location 155. The second memory location stores pixel data for pixel 1, the fifth memory location stores pixel data for pixel 4, and so on.

4. Pixel Rates

FIG. 2 is a representation of screen resolutions and typical data throughput requirements. FIG. 2 shows four resolutions in respective areas: VGA resolution (640×480) 205, XGA resolution (1024×768) 210, SXGA resolution (1280×1024) 215, and HD resolution (1920×1080) 220. The pixel rate for a screen resolution is the number of pixels per second that need to be processed to maintain the screen resolution at a specified refresh rate (i.e., the number of times a complete frame is drawn to the screen per second). While pixel rates vary among implementations, the pixel rates shown in FIG. 2 are representative. These pixel rates are given in mega-pixels per second ("MP/S"). For example, according to SMPTE 274M-1998 (a specification defining, among other things, pixel rates for resolutions of 1920×1080), for HD resolution 220 the pixel rate is about 150 MP/S @60 Hz. FIG. 2 also shows a corresponding approximate data rate in megabytes per second ("MB/S") for each resolution. The data rate is the number of bytes per second to be processed based on the number of bytes per pixel and the pixel rate. For example, HD resolution 220 has a data rate of 450 MB/S, at 24 bits per pixel (3 bytes). If each pixel has 32 bits of data, the data rate for HD resolution is 600 MB/S. However, the data rate of a typical 32-bit wide SDRAM running at 125 MHz is approximately 500 MB/S. A frame buffer architecture using two 125 MHz SDRAM's can realize a data rate of approximately 1000 MB/S. Alternatively, a faster SDRAM, such as one running at 150 MHz, can meet 600 MB/S.

5. Frame Buffers Using Parallel Storage in Two Memory Devices

FIG. 3A is a representation of a frame 305 of pixels 310 divided between two memory devices. Frame 305 has only 32 pixels for simplicity, but, as noted above, a typical HD resolution frame has 2,073,600 pixels. FIG. 3B is a representation of a first memory device 350 and FIG. 3C is a representation of a second memory device 375. Each pixel 310 in frame 305 is numbered, starting with pixel 0 in the upper left of frame 305. Even-numbered pixels are stored in first memory device 350 and odd-numbered pixels are stored in second memory device 375. The pixels stored in second memory device 375 are also shaded for clarity in FIGS. 3A and 3C.

FIG. 4 is a block diagram of a typical frame buffer architecture 400 capable of accessing pixel data for two pixels in parallel, supporting the representations shown in FIGS. 3A, 3B, and 3C. For example, frame buffer architecture 400 can be used in a typical scan converter. A video source 405 provides pixel data to a first memory 410 (recall first memory device 350 in FIG. 3B) and to a second memory 415 (recall second memory device 375 in FIG. 3C) in parallel and a video destination 420 retrieves pixel data from first memory 410 and from second memory 415 in parallel. In this implementation, pixel data for each pixel is stored in a separate addressable memory location. Video source 405 receives video data from another source (not shown), such as a broadcast source or a software application running on a computer system connected to video source 405. Video destination 420 controls the display of each pixel on a video device (not shown), such as a CRT. First memory 410 and second memory 415 are separate memory devices such as two SDRAM's. A first data bus 425 is connected to video source 405, first memory 410, and video destination 420. A second data bus 430 is connected to video source 405, second memory 415, and video destination 420. A source address bus 435 is connected to video source 405 and a first input 440 of an address multiplexor 445. A destination address bus 450 is connected to video destination 420 and a second input 455 of address multiplexor 445. An output 460 of address multiplexor 445 is connected to first memory 410 and second memory 415. Accordingly, the same address is provided to both first memory 410 and second memory 415. Address multiplexor 445 receives a control signal (not shown) to cause first input 440 or second input 455 to connect to output 460. First memory 410 and second memory 415 also receive control signals (not shown) to control whether memories 410 and 415 will read in data (write mode) or read out data (read mode). In addition, while clock lines are not shown in FIG. 4, architecture 400 operates based on clock cycles so that pixel data can be processed for two pixels per clock cycle in support of the desired pixel rate.

In operation, memories 410 and 415 read in or store complementary halves of a frame of pixels as pixel data from video source 405 and output the pixel data to video destination 420. To store pixel data, memories 410 and 415 are put in write mode and address multiplexor 445 is set to connect first input 440 to output 460. Video source 405 provides pixel data for a first pixel to first data bus 425, such as pixel 0 in FIG. 3A, and pixel data for a second pixel to second data bus 430, such as pixel 1 in FIG. 3A. First data bus 425 provides its pixel data to first memory 410 and second data bus 430 provides its pixel data to second memory 415. Video source 405 also provides an address to source address bus 435. To calculate the address, video source 405 can use a counter. Because each memory 410 and 415 stores pixel data for half the pixels in one frame, the counter typically ranges from 0 to one less than one-half of the number of pixels in one frame. Video source 405 can increment the counter by 1 for each pixel pair. Source address bus 435 provides the address to first input 440 of address multiplexor 445. Address multiplexor 445 in turn provides the address to first memory 410 and second memory 415. First memory 410 stores the pixel data on first data bus 425 at the address supplied by address multiplexor 445 from video source 405. Second memory 415 stores the pixel data on second data bus 430 at the same address. Two pixels have been stored in parallel in two memories using the same address. Referring to FIGS. 3A, 3B, and 3C, pixel 0 and pixel 1 are stored at the same time at the same address in first memory device 350 and second memory device 375, respectively. Accordingly, for example, pixel 0 is at address 0 in first memory device 350, pixel 1 is at address 0 in second memory device 375, pixel 2 is at address 1 in first memory device 350, pixel 3 is at address 1 in second memory device 375, and so on.

To retrieve pixel data, memories 410 and 415 are put in read mode and address multiplexor 445 is set to connect second input 455 to output 460. Video destination 420 provides an address to destination address bus 450. Destination address bus 450 provides the address to second input 455 of address multiplexor 445. Address multiplexor 445 in turn provides the address to first memory 410 and second memory 415. First memory 410 provides the pixel data stored at the address supplied by address multiplexor 445 from video destination 415 to first data bus 425. Second memory 415 provides the pixel data stored at the same address to second data bus 430. First data bus 425 provides its pixel data to video destination 420 and second data bus 430 provides its pixel data to video destination 420. Two pixels have been retrieved in parallel from two memories using the same address. Referring to FIGS. 3A, 3B, and 3C, pixel 0 and pixel 1 can be retrieved at the same time using the same address from first memory device 350 and second memory device 375, respectively.

FIG. 5 is a block diagram of another implementation of a dual pixel frame buffer architecture 500. Architecture 500 is similar to architecture 400 of FIG. 4, but a memory controller 545 provides data and addresses to memories 510 and 515. Memory controller 545 receives pixel data from video source 505 to store in memories 510 and 515. Memory controller 545 retrieves pixel data from memories 510 and 515 and provides the pixel data to video destination 520. Memory controller 545 replaces address multiplexor 445. Memory controller 545 receives signals from video source 505 and video destination 520 indicating whether pixel data is to be stored to or retrieved from memories 510 and 515. Memory controller 545 generates addresses and supplies these addresses along with control signals to memories 510 and 515. Accordingly, memory controller 545 controls address generation rather than video source 505 and video destination 520, as compared with architecture 400 of FIG. 4. In addition, as noted above with respect to FIG. 4, architecture 500 operates based on clock cycles so that pixel data can be processed for two pixels per clock cycle in support of the desired pixel rate.

6. Double-Buffering

Typical frame buffer architectures often also utilize "double-buffering." Double-buffering is a well known technique where the memory address space of a frame buffer is divided into two sections. In some architectures, each section is a separate memory device, and in other architectures one or more devices are each divided into sections. Data from a frame is stored in one section while data from a previously stored frame is read from the other section. Series of reading and writing operations alternate. For example, after storing pixel data for 16 pixels, pixel data for 16 pixels is retrieved. After storing a frame, the sections switch roles. Pixel data for blocks of pixels can be temporarily stored before being sent to memory or after being received from memory in a buffer, such as a FIFO buffer. In architectures 400 and 500 from FIGS. 4 and 5, respectively, FIFO buffers can be included in both the video source and the video destination, or in the memory controller.

7. SDRAM

Various types of memory devices can be used in implementing a frame buffer. One common type of memory used is SDRAM (synchronous dynamic random access memory). The structure and operation of SDRAM is well known. In overview, an SDRAM has a number of addressable memory locations that depends on the total size of the SDRAM and the size of each memory location. Each addressable memory location has a corresponding memory address. For example, an 8 MB (megabyte) SDRAM where each location is 32 bits has 2,097,152 addressable locations, while an 8MB SDRAM were each location is 8 bits has four times as many addressable locations. FIG. 6A is a representation of 2,097,152 memory locations as a one-dimensional array 605. Memory cells in a typical SDRAM are physically arranged in a two-dimensional grid and so individual cells can be identified using a combination of a row number and a column number. The memory locations within the same row are often collectively referred to as a "page." FIG. 6B is a representation of 2,097,152 memory locations as a two-dimensional array or grid 650 having X columns and Y rows. In FIG. 6B, grid 650 has 256 columns 655, from 0 to X−1, and 8192 rows or pages 660, from 0 to Y−1. Accordingly, the location in row y at column x has address (y*X+x). For example, location 665 (the first location in the last page) has address (X*(Y−1)) and location 670 (the last location in the last page) has address (X*Y−1). The sizes of the boxes representing locations in FIG. 6C are representative and not to scale, so different size boxes are not different size memory locations (e.g., locations 665 and 670).

An address for a memory cell can be viewed as a combination of a row address and a column address. FIG. 6C is a representation of an address 675 for one memory location out of 2,097,152. Address 675 has 21 bits, with A0 as the lowest order bit. The lower 8 bits, A0 to A7, are a column address 680, ranging from 0 to 255. The upper 13 bits, A8 to A20, are a row or page address 685, ranging from 0 to 8191.

Due to the nature of the construction of SDRAM, an entire page of memory cells is active at a time. Accessing cells within the same page can be accomplished relatively quickly using a series of column addresses without changing the page address. To change pages, a new page address is used and an additional delay is incurred from both the extra address cycle and a delay in the memory changing which page is active. This delay is referred to as a "page miss" and can result in a loss in speed. SRAM (static random access memory) typically does not incur the same page miss delay as SDRAM, but SRAM is typically more expensive than SDRAM.

In a conventional frame buffer using SDRAM, pixel data for horizontally neighboring pixels is typically stored in the same page of memory. Referring to FIGS. 1A and 1B, pixel data for pixels 0, 1, 2, and 3 would be stored in one page, pixel data for pixels 4, 5, 6, and 7 would be stored in another page, and so on. In a parallel architecture, such as architecture 400 in FIG. 4, a page stores pixel data for every other horizontally aligned pixel, such as the first page of memory device 350 storing pixel data for pixels 0, 2, 4, and 6 in FIGS. 3A and 3B. Storing and retrieving pixel data can be accomplished quickly with few page misses because pixel data in a conventional raster scan system is processed in row order (left to right, top to bottom) for both storing and retrieving. The pixel data for pixels in different rows are typically not stored in the same page, and so page misses occur when pixel data is to be stored or retrieved for pixels from different rows. For example, retrieving pixel data for pixels 0, 1, 2, and 3 would cause one page miss (the initial page miss in the first access), but retrieving pixel data for pixels 0, 4, 8, and 12 would cause four page misses.

SUMMARY

The present disclosure provides methods and apparatus for implementing a pixel page system providing pixel pages using combined addressing. In alternative implementations, the system stores and retrieves data other than pixel data. In one implementation, a pixel page system includes: a data source, providing pixel data for pixels in a first order, where each pixel is in a frame of pixels, the frame having horizontal rows of pixels, vertical columns of pixels, a first section of pixels, and a second section of pixels; a data destination, receiving pixel data for pixels in a second order; at least one memory device, each memory device having a plurality of memory pages including a plurality of memory locations divided between a first memory page section and a second memory page section, each memory location having an address; and where pixel data for each pixel corresponds to an entry in one of a plurality of pixel pages, each pixel page having a plurality of pixel page rows each including a plurality of pixels and a plurality of pixel page columns each including a plurality of pixels, and each pixel page corresponds to a respective memory page, and pixels in the first section of pixels are in a first pixel page section and pixels in the second section of pixels are in a second pixel page section, where pixel data is stored to the memory device in the first order and retrieved from the memory device in the second order, and where each memory page stores pixel data in multiple locations according to the first order and stores pixel data in multiple locations according to the second order, where pixel data for pixels in the first pixel page section is stored in memory pages in the first memory page section and pixel data for pixels in the second pixel page section is stored in memory pages in the second memory page section, where at least two consecutive memory pages in the first memory page section are not contiguous, and at least two consecutive memory pages in the second memory page section are not contiguous.

In another implementation, a method of storing and retrieving pixel data includes: storing pixel data for a first frame of pixels in a first memory device using pixel pages, where the first memory device includes a plurality of memory pages, and at least one memory page stores pixel data for at least two pixels from each of at least two horizontal rows of pixels in the first frame of pixels; storing pixel data for a second frame of pixels in a second memory device using pixel pages, where the second memory device includes a plurality of memory pages, and at least one memory page stores pixel data for at least two pixels from each of at least two horizontal rows of pixels in the second frame of pixels; retrieving pixel data for the first frame of pixels from the first memory device using pixel pages; and retrieving pixel data for the second frame of pixels from the second memory device using pixel pages, where pixel data is stored and retrieved using a first addressing system for pixels in a first pixel page section and using a second addressing system for pixels in a second pixel page section.

BRIEF DESCRIPTION OF THE DRAWINGS

FIG. 3A is a representation of a frame of pixels divided between two memory devices.

FIG. 3B is a representation of a first memory device.

FIG. 3C is a representation of a second memory device.

FIG. 7 is a representation of a frame of pixels according to the present invention.

FIG. 8 is a representation of one implementation of a pixel page of pixels in a 1920×1080 HD resolution implementation according to the present invention.

FIG. 10 is a table showing the relationships among a pixel, a frame row, a frame column, a pixel page, a pixel page row, a pixel page column, a memory page, and a memory address for an HD resolution implementation (1920×1080) according to the present invention.

DETAILED DESCRIPTION

Figure 1A:
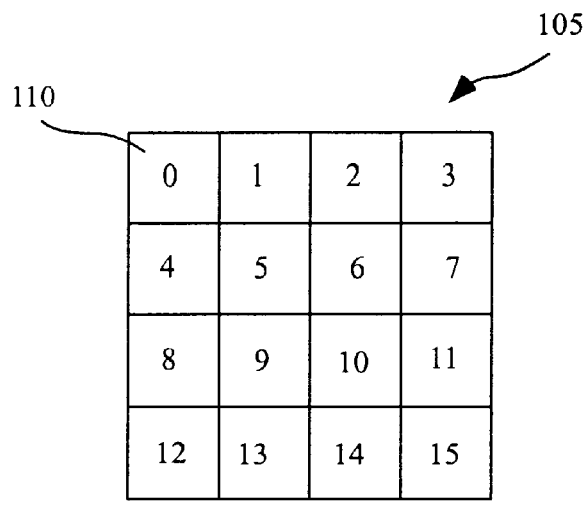
FIG. 1A is a representation of a screen as a grid of pixels.
Figure 1B:
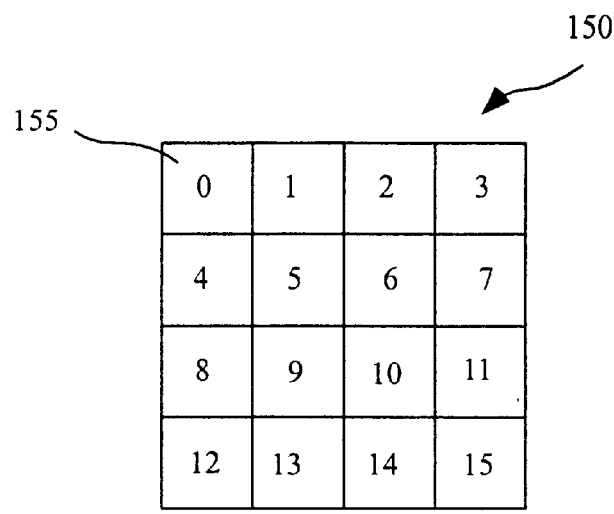
FIG. 1B is a representation of a memory device implementing a frame buffer as a grid of memory locations.
Figure 2:
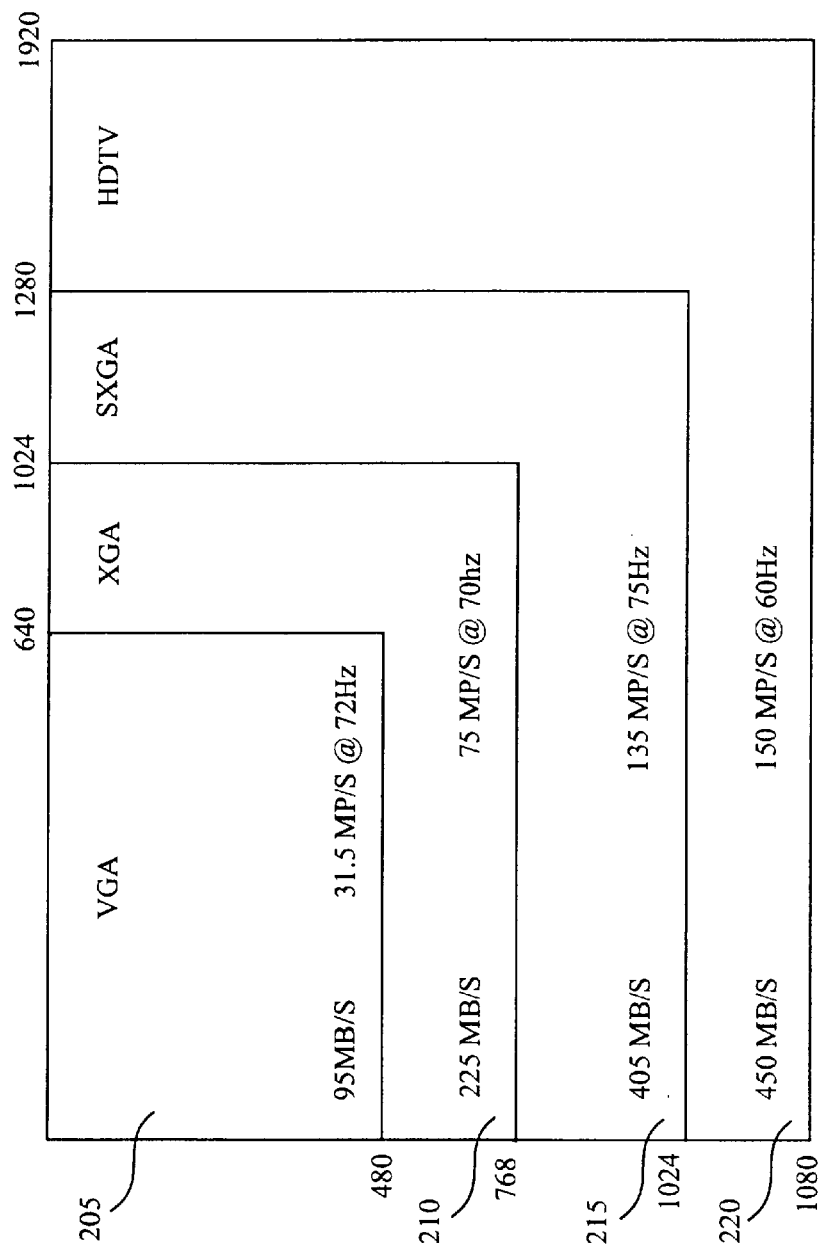
FIG. 2 is a representation of screen resolutions and typical data throughput requirements.

The present invention provides methods and apparatus for implementing a pixel page system providing pixel pages using combined addressing. Pixel data is stored and retrieved using pixel pages. The pixel pages are mapped to memory pages using two different addressing systems. Using the two addressing systems provides combined addressing. Combined addressing accommodates a difference between the geometry of the screen resolution and the geometry of the corresponding memory space. For example, as described below, one HD resolution is 1920×1080 while the corresponding memory space divides evenly (based on powers of two) into a geometry of 2048×1024.

As described in application Ser. No. 10/051,538 filed Jan. 16, 2002, a pixel page is a two-dimensional array of pixels. A pixel page maps pixel data to memory locations for a region of pixels from multiple rows and columns of pixels in a frame. The memory locations within a memory device corresponding to one pixel page are in the same physical memory page. Pixel data is stored according to horizontal rows of pixels and retrieved according to vertical columns of pixels. In an alternative implementation, data other than pixel data is stored and retrieved using buffer pages and combined addressing according to a first order and a second order, respectively.

A. Pixel Pages

Pixel pages are used in a frame buffer for storing pixel data. Pixel data is supplied to the frame buffer according to the horizontal order of pixels in a frame, such as from left to right, top to bottom. Pixel data is provided by the frame buffer according to the vertical order of pixels in a frame, such as from top to bottom, left to right. Pixel pages are configured to support storing and retrieving pixel data in these two different orders. In an alternative implementation, pixel data is supplied to the frame buffer according to vertical columns of pixels and provided by the frame buffer according to horizontal rows of pixels.

Each pixel page is a two-dimensional mapping of pixels and pixel data to memory locations, aligning rows and columns within the pixel page with rows and columns in the frame of pixels. One dimension of the pixel page, referred to as pixel page rows, corresponds to horizontal rows of pixels in the frame, referred to as frame rows. A second dimension of the pixel page, referred to as pixel page columns, corresponds to vertical columns of pixels in the frame, referred to as frame columns. A pixel page has multiple pixel page rows and multiple pixel page columns. Each pixel page indicates memory locations from a single physical memory page so that consecutive accesses to locations from a single pixel page do not cause page misses. Accordingly, accessing consecutive locations corresponding to a pixel page along a pixel page row or along a pixel page column does not cause page misses. Page misses can occur at the end of a pixel page row or pixel page column in making a transition to another pixel page. By storing pixel data along pixel page rows and retrieving data along pixel page columns, page misses can be reduced in processing pixel data that is to be stored in one order and retrieved in another order.

FIG. 7 is a representation of a frame 705 of pixels 710. Frame 705 has 16 frame columns and 16 frame rows (16×16; 256 pixels) for simplicity, but other resolutions are possible. For example, as noted above, a frame in one typical HD resolution is 1920×1080 (2,073,600 pixels). Pixels 710 in frame 705 are sequentially numbered from 0 to 255. Frame 705 is divided into pixel pages 715, outlined in heavier lines. Pixel pages 715 have a pixel page geometry of 4×4. Each pixel page 715 includes 16 pixels 710, in four pixel page columns 720 and four pixel page rows 725. Accordingly, a pixel page column 720 includes four pixels 710, and a pixel page row 725 includes four pixels 710. For example, pixels 0, 16, 32, and 48 are in one pixel page column 720 and pixels 0, 1, 2, and 3 are in one pixel page row 725. Frame 705 has 16 pixel pages 715, four horizontally by four vertically.

Pixel data for each pixel page 715 is stored in a respective page of physical memory. The description here referring to addressing and FIG. 7 introduces pixel pages and addressing, but does not describe combined addressing. Combined addressing is described later. For frame 705, the first page of memory stores pixel data for the pixel page 715 including pixels 0, 1, 2, 3, 16, 17, 18, 19, 32, 33, 34, 35, 48, 49, 50, and 51. The second page of memory stores pixel data for the pixel page 715 including pixels 4, 5, 6, 7, 20, 21, 22, 23, 36, 37, 38, 39, 52, 53, 54, 55, and so on. Pixel data is stored to memory locations according to the order of the pixels in the pixel page. For frame 705, pixel data for pixels in the first pixel page 715 are stored at the following addresses (pixel-address): 0-0, 1-1, 2-2, 3-3, 16-4, 17-5, 18-6, 19-7, 32-8, 33-9, 34-10, 35-11, 48-12, 49-13, 50-14, and 51-15.

In storing pixel data for frame 705, pixel data is stored for pixels 710 in horizontal row order (left to right, top to bottom): 0, 1, 2, 3, 4, and so on. Pixel data is stored following the pixel page rows 725 of pixel pages 715 (e.g., horizontally). A page miss occurs at the boundary of each pixel page 715, at the end of a pixel page row 725 (as described below, some page misses can be hidden using burst accessing, depending on the type of memory device). Because pixel pages 715 are four pixels 710 wide, a page miss would occur storing pixel data for every four pixels 710, i.e., storing pixel data for pixel 0, for pixel 4, pixel 8, etc. Storing one frame 705 of pixel data would cause a total of 64 page misses (4*16).

In retrieving pixel data for frame 705, pixel data is retrieved for pixels 710 in vertical column order (top to bottom, left to right): 0, 16, 32, 48, 64, and so on. Pixel data is retrieved following the pixel page columns 720 of the pixel pages 715 (e.g., vertically). A page miss occurs at the end of each pixel page column 720. Because pixel pages 715 are four pixels 710 tall, a boundary of a pixel page 715 occurs vertically every four pixels 710. Accordingly, a page miss would occur retrieving pixel data for every four pixels 710, i.e., retrieving pixel data for pixel 0, for pixel 64, for pixel 128, etc. Retrieving one frame 705 of pixel data would cause a total of 64 page misses (4*16).

The total page misses in processing one frame 705 using pixel pages 715 would be 128. By comparison, if pixel data were stored corresponding to horizontal frame rows of pixels, i.e., pixel data for pixels 0 through 15 were stored in the same memory page, a page miss would occur every 16 pixels for storing pixel data and every pixel for retrieving pixel data. Storing one frame would cause 16 page misses (1*16) and retrieving one frame would case 256 page misses (16*16). The total page misses in processing one frame would be 272. Accordingly, pixel pages can provide a significant speed improvement without changing the physical memory device.

FIG. 8 is a representation of one implementation of a pixel page 805 of pixels 810 in a 1920×1080 HD resolution implementation. Pixel page 805 has a pixel page geometry of 16×16. Pixels 810 in pixel page 805 are numbered as the pixels 810 would be numbered in the corresponding 1920× 1080 frame for the first pixel page 805. Pixel page 805 includes 256 pixels 810, in 16 pixel page columns 815 (numbered 0 to 15) and 16 pixel page rows 820 (numbered 0 to 15). A pixel page column 815 includes 16 pixels 810 and a pixel page row 820 includes 16 pixels 810. For clarity, not every pixel 810 of pixel page 805 is shown in FIG. 8. Ellipses indicate intervening pixels 810.

As described above, an HD resolution frame has 2,073, 600 pixels, in 1920 frame columns and 1080 frame rows. In one implementation, each pixel page 805 is 16 pixels 810 wide, so one frame has 120 pixel pages 805 horizontally. Each pixel page 805 is 16 pixels 810 tall, so one frame has 68 pixel pages 805 vertically (though the pixel pages 805 in the 68$^{th}$ row of pixel pages 805 are not completely filled with valid screen pixels, where a "valid" screen pixel is a pixel in the frame for which pixel data has been provided from the video source, and an "invalid" screen pixel is outside the dimensions of the screen resolution (e.g., frame rows beyond 1079 in HD resolution 1920×1080). In total, one frame has 8160 pixel pages 805 allocated, where each allocated pixel page has a corresponding memory page. In an HD resolution implementation, pixel data is stored and retrieved in similar sequences to those described above. Pixel data is stored along horizontal frame rows, such as this sequence of pixels: 0, 1, 2, 3, 4, and so on. Pixel data is retrieved along vertical frame columns, such as this sequence of pixels, 0, 1920, 3840, 5760, and so on.

Figure 9:
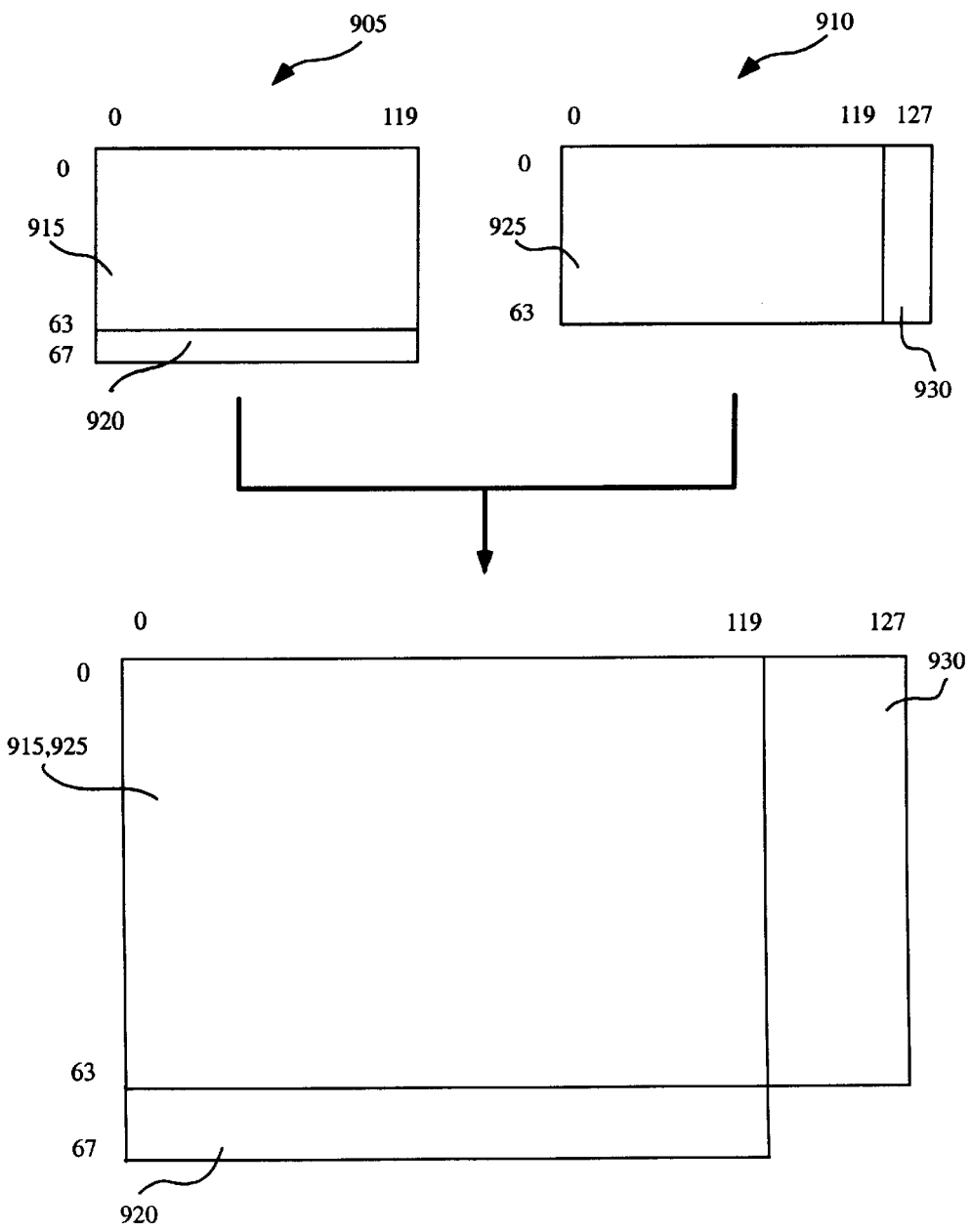
FIG. 9 is a representation of mapping a frame of pixel pages to a memory block of memory pages according to the present invention.

FIG. 9 is a representation of mapping a frame 905 of pixel pages to a memory block 910 of memory pages. Frame 905 and memory block 910 are shown separately and then partially overlapping. Frame 905 is an HD resolution frame, 1920×1080. Columns of pixel pages are numbered from 0 to 119 and rows of pixel pages are numbered from 0 to 67. Individual pixel pages are not shown in FIG. 9. Pixel pages are numbered from 0, left to right, top to bottom. For example, pixel page 0 is in row 0 at column 0 and pixel page 120 is in row 1 at column 0. Pixels within frame 905 are numbered as described above (e.g., pixels in the first row of pixels are numbered from 0 to 1919). Frame 905 includes 8160 pixel pages, 120×68, divided into a first pixel page section 915 and a second pixel page section 920. First pixel page section 915 includes the first 64 horizontal rows of pixel pages (pixel pages 0–7679). First pixel page section 915 also defines a first section of pixels, frame rows 0–1023. Second pixel page section 920 includes the last four horizontal rows of pixel pages (pixel pages 7680–8159). Second pixel page section 920 also defines a second section of pixels, frame rows 1024–1079. In addition, in FIG. 9, first pixel page section 915 is unshaded and second pixel page section 920 is shaded.

Memory block 910 is 8 MB of memory divided into 8192 memory pages, further divided into a first memory page section 925 and a second memory page section 930. Individual memory pages are not shown in FIG. 9. Memory pages in memory block 910 are arranged in a two-dimensional array, 128×64, each dimension based on a power of two. Columns of memory pages are numbered from 0 to 127 and rows of memory pages are numbered from 0 to 63. Memory pages are numbered from 0, left to right, top to bottom. For example, memory page 0 is in row 0 at column 0 and memory page 128 is in row 1 at column 0. Each memory page includes 256 locations, each location having an address. The addresses within a memory page increase from a starting address. Each successive memory page has a starting address 256 greater than the previous memory page. Memory pages are arranged in memory block 915 sequentially left to right and top to bottom. For example, the first address of memory page 0 (in row 0 at column 0) is 0. The first address of memory page 1 (in row 0 at column 1) is 256. The first address of memory page 128 (in row 1 at column 0) is 32768.

First memory page section 925 includes the first 120 columns of memory pages (0–119). Second memory page section 930 includes the last eight columns of memory pages (120–127). In addition, in FIG. 9, first pixel page section 915 is unshaded and second pixel page section 920 is shaded. Each row of memory pages is divided between first memory page section 925 and second memory page section 930. Accordingly, memory pages in first memory page section 925 are not all contiguous to one another and memory pages in second memory page section 930 are not all contiguous to one another. For example, in row 0, memory page 119 is in first memory page section 925. The next contiguous memory page is memory page 120 and memory page 120 is in second memory page section 930. The next consecutive memory page in first memory page section 925 after memory page 119 is memory page 128 in row 1, which is not contiguous with memory page 119. Similarly, memory page 127 is in second memory page section 930 while the next contiguous memory page in memory block 910, memory page 128, is in first memory page section 925. The next consecutive memory page in second memory page section 925 after memory page 127 is memory page 248 in row 1, which is not contiguous with memory page 127.

Pixel pages in first pixel page section 915 are mapped to memory pages in first memory page section 925 and pixel pages in second pixel page section 920 are mapped to memory pages in second memory page section 930. As shown in FIG. 9, the rows and columns align from row 0, column 0. First pixel page section 915 and first memory page section 925 overlap, and second pixel page section 920 and second memory page section 930 do not overlap. The overlapping and non-overlapping sections of frame 905 and memory block 910 indicate the mapping of pixel pages to memory pages. Where frame 905 and memory block 910 overlap (i.e., first pixel page section 915 and first memory page section 925; rows 0 to 63, columns 0 to 119), as indicated by unshaded boxes, the pixel pages in frame 905 are mapped to the memory pages at the same position in memory block 910. For example, pixel page 0 (in row 0 at column 0) is mapped to memory page 0 (in row 0 at column 0). Where frame 905 and memory block 910 do not overlap (i.e., second pixel page section 920 and second memory page section 930; rows 64 to 67, columns 0 to 119, and rows 0 to 63, columns 120 to 127), as indicated by shaded boxes, the pixel pages in the non-overlapping section of frame 905 (i.e., rows 64 to 67, columns 0 to 119) are mapped to the memory pages in the non-overlapping section of memory block 910 (i.e., rows 0 to 63, columns 120 to 127). In one implementation, the pixel pages in the non-overlapping section of frame 905 are mapped sequentially to the memory pages in the non-overlapping section of memory block 910. For example, pixel page 7680 (in row 64 at column 0) is mapped to the memory page 120 (in row 0 at column 120), and pixel page 7681 (in row 64 at column 1) is mapped to memory page 121 (in row 0 at column 121).

As a result, the mapping of pixel pages to memory pages is different in the first and second sections of frame 905 and memory block 910. This mapping determines the address of the memory location that stores pixel data for a pixel. Accordingly, the two different mappings indicate two different addressing systems. Addresses generated using the first addressing system are used for the overlapping sections and addresses generated using the second addressing system are used for the non-overlapping sections. In one implementation, the first addressing system uses bit-field manipulation of counters and the second addressing system uses counters as indexes into a look-up table. The two addressing systems are used together to provide combined addressing. An illustrative implementation using combined addressing is described below.

FIG. 10 is a table 1000 showing the relationships among a pixel, a frame row, a frame column, a pixel page, a pixel page row, a pixel page column, a memory page, and a memory address for an HD resolution implementation (1920×1080) using combined addressing and pixel pages 805 in FIG. 8. In FIG. 10, the pixel data for a frame is stored in a single memory device having 256 memory locations per memory page. In addition, FIG. 10 shows only a representative sample of pixels from a frame for clarity. As described above, an HD resolution frame has 2,073,600 pixels.

Column 1005 indicates the number of a pixel for which related information is shown in table 1000. Pixels in a frame are numbered from 0, left to right, top to bottom. For example, the first pixel in the frame is numbered 0, the last pixel of the first frame row is numbered 1919, and the first pixel of the second frame row is numbered 1920. Column 1010 indicates a frame row including the pixel in column 1005. Frame rows are numbered from 0, top to bottom. Column 1015 indicates a frame column including the pixel in column 1005. Frame columns are numbered from 0, left to right. Column 1020 indicates a pixel page including the pixel in column 1005. Pixel pages in a frame are numbered from 0, left to right, top to bottom. Column 1025 indicates a pixel page row including the pixel in column 1005. Pixel page rows are numbered from 0, from top to bottom within the pixel page including the pixel page row. Column 1030 indicates a pixel page column including the pixel in column 1005. Pixel page columns are numbered from 0, left to right within the pixel page including the pixel page column. Column 1035 indicates a memory page storing pixel data for the pixel in column 1005. Memory pages are numbered sequentially from 0. Column 1040 indicates a memory address of a memory location storing pixel data for the pixel in column 1005. For example, the first pixel of a frame is pixel 0, in frame row 0 and frame column 0, in pixel page row 0 and pixel page column 0 of pixel page 0, stored at memory address 0 in memory page 0.

Table 1000 shows memory addresses reflecting one mapping of pixel pages to memory pages using combined addressing. Referring to FIG. 9, where frame 905 overlaps memory block 910, pixel pages are mapped to memory pages in the same row and column position. For example, pixel 0 is in pixel page row 0 of pixel page 0 and pixel data for pixel 0 is stored in memory page 0 at address 0. Pixel 16 is in pixel page 1 and pixel data for pixel 16 is stored in memory page 1 at address 256. Pixel 1920 is in pixel page row 1 of pixel page 0 and pixel data for pixel 1920 is stored in memory page 0 at address 16. In the next row of pixel pages, starting with pixel 30720 and pixel page 120, eight memory pages (memory pages 120–127) have been skipped because these memory pages are in the non-overlapping section of memory block 910 (these memory pages are used for later pixel pages, as described below). For example, pixel 30720 is in pixel page 120 and pixel data for pixel 30720 is stored in memory page 128 at address 32768. This pattern continues throughout the overlapping section of frame 905, through pixel 1966079 in frame row 1023 at frame column 1919.

The first pixel in the non-overlapping section of frame 905, pixel 1966080, is in pixel page 7680. Pixel pages in the non-overlapping section of frame 905 are mapped to memory pages in the non-overlapping section of memory block 910, from left to right, top to bottom. Pixel pages in the non-overlapping section of frame 905 include pixel pages 7680 through 8159. Memory pages in the non-overlapping section of memory block 910 include memory pages 120–127, 248–255, 376–383, . . . , 8184–8191. These pixel pages are mapped sequentially to these memory pages. For example, pixel pages 7680–7687 are mapped to memory pages 120–127, pixel pages 7688–7695 are mapped to memory pages 248–255, and so on. For example, pixel 1966080 is in pixel page 7680 and pixel data for pixel 1966080 is stored in memory page 120 at address 30720. Pixel 1966208 is in pixel page 7688, the eighth pixel page from the left in the non-overlapping section of frame 905, and pixel data for pixel 1966208 is stored in memory page 248 at address 63488. Pixel 1996800 is in pixel page 7800, the first pixel page in the second row of pixel pages in the non-overlapping section of frame 905 (row 65 in FIG. 9), and pixel data for pixel 1996800 is stored in memory page 2040 at address 522240. The last pixel of frame 905 is pixel 2073599 in pixel page 8159 and pixel data for pixel 2073599 is stored in memory page 7679 at address 1965951 (recalling as well that the last pixel is in the eighth pixel page row, not the last pixel page row, of the last pixel page).

The non-overlapping section of frame 905 includes 480 pixel pages and the non-overlapping section of memory block 910 includes 512 memory pages, so 32 memory pages (memory pages 7800–7807, 7928–7935, 8056–8063, 8184–8191) do not have corresponding mapped pixel pages. These remaining memory pages 920 can store other data, such as the look-up table of addresses used for the second addressing system, as described below.

B. Video Data System Using Pixel Pages

Figure 11:
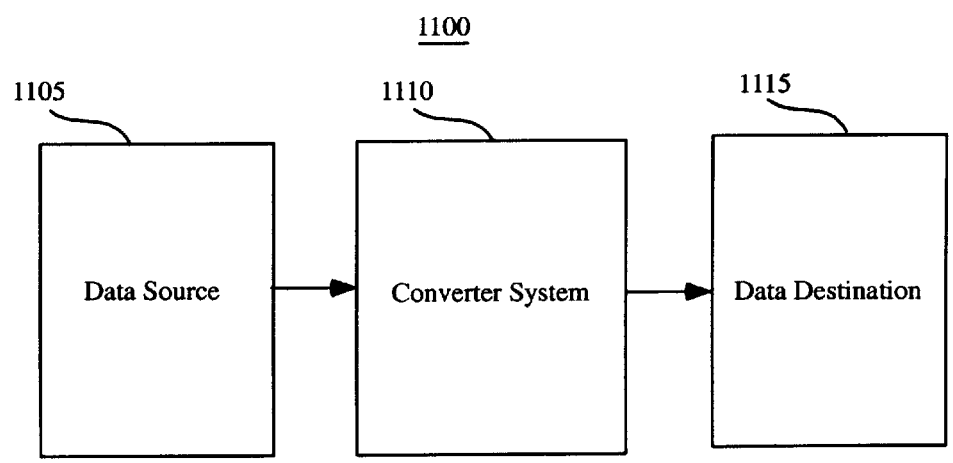
FIG. 11 is a block diagram of a video data system according to the present invention.

FIG. 11 is a block diagram of a video data system 1100. A data source 1105 provides video data for frames of pixels to a converter system 1110 in a first order. Converter system 1110 stores the data using pixel pages, as described above. Converter system 1110 retrieves the data in a second order and provides the retrieved data to a data destination 1115. For a video application, converter system 1110 can be used as a type of scan converter between data source 1105 and data destination 1115.

Data source 1105 is a video source providing pixel data to converter system 1110 and data destination 1115 is a display system, such as a GLV system using one or more GLV's.

Data source 1105 provides pixel data according to horizontal rows of pixels and data destination 1115 receives pixel data according to vertical columns of pixels, as described above. Converter system 1110 provides the conversion.

Data source 1105 can be implemented to provide pixel data according to various screen resolutions, such as an HD resolution of 1920×1080. While the discussion herein focuses on this HD resolution, alternative implementations can accommodate other resolutions. For an HD resolution signal, data source 1105 provides pixel data for a progressive signal (e.g., 1920×1080p). Data source 1105 can be implemented to receive an interlaced signal (e.g., 1920×1080i) and provide a progressive signal, such as by merging interlaced fields using a de-interlacer. In an alternative implementation, data source 1105 provides an interlaced signal, providing pixel data for half the screen pixels (i.e., first field) and then pixel data for the other half (i.e., second field). In another implementation, data source 1105 provides pixel data using progressive segmented frames ("PSF," by Sony Corporation of Japan, Inc.).

Each pixel has 32 bits of pixel data. In one implementation, 11 bits are for red, 11 bits are for green, and 10 bits are for blue. Alternative implementations may have different allocations (e.g., 10 bits per color) or pixel depths (e.g., 8 or 24 bits per pixel). Where data source 1105 provides pixel data at 1920×1080p and 32 bits per pixel, the pixel rate is approximately 150 MP/S and the data rate from data source 1105 is approximately 600 MB/S. Accordingly, converter system 1110 stores pixel data from data source 1105 at a data rate of approximately 600 MB/S. To provide pixel data at a rate to support the same resolution, 1920×1080p, converter system 1110 outputs pixel data to data destination 1115 at a data rate of approximately 600 MB/S.

Data destination 1115 can be a color GLV system. One color GLV system includes three GLV's: one for red, one for green, and one for blue. As described above, a GLV uses vertical columns of pixels to form an image (projecting one column at a time, typically left to right). In a color GLV system, each GLV projects a column of pixels (e.g., 1088 pixels, though only 1080 may have corresponding pixel data from the video data source) at a time. The three color columns are combined (such as using mirrors and lenses) to form a single apparent column on the viewing area (not shown in FIG. 11). Accordingly, it is advantageous for the GLV system to receive pixel data according to vertical columns of pixels, rather than horizontal rows. Converter system 1110 provides the pixel data to the GLV system corresponding to vertical columns of pixels. In alternative implementations, data destination 1115 can be some other video device that uses pixel data corresponding to vertical columns of pixels, such as a graphics card or a video image processor (e.g., for image transformations).

C. Pixel Page System Using Two Memory Devices

An HD implementation (1920×1080 screen resolution) of a pixel page system using combined addressing is described below. This implementation is illustrative of the operation of one system and alternative implementations are possible. The operation of this system is similar to the pixel page systems described in application Ser. No. 10/051,538, filed Jan. 16, 2002, except that pixel data is stored and retrieved using combined addressing.

Figure 4:
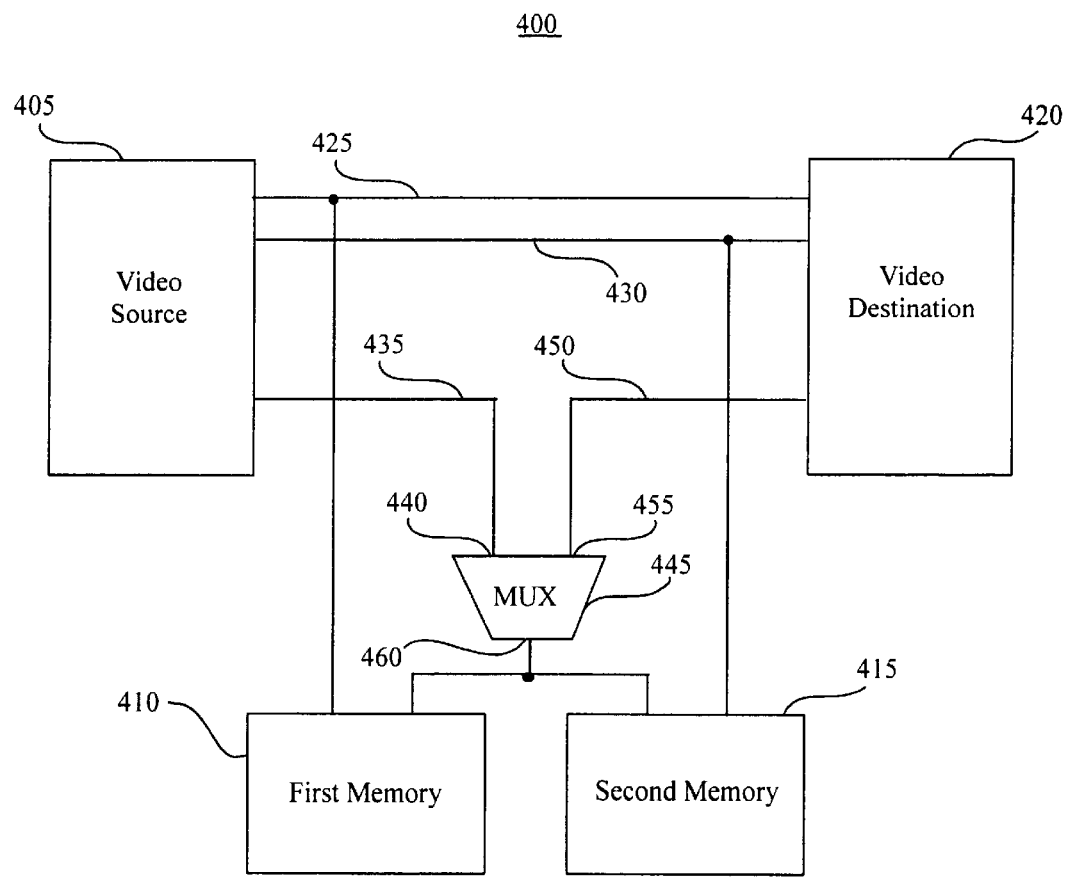
FIG. 4 is a block diagram of a typical frame buffer architecture capable of accessing pixel data for two pixels in parallel.
Figure 5:
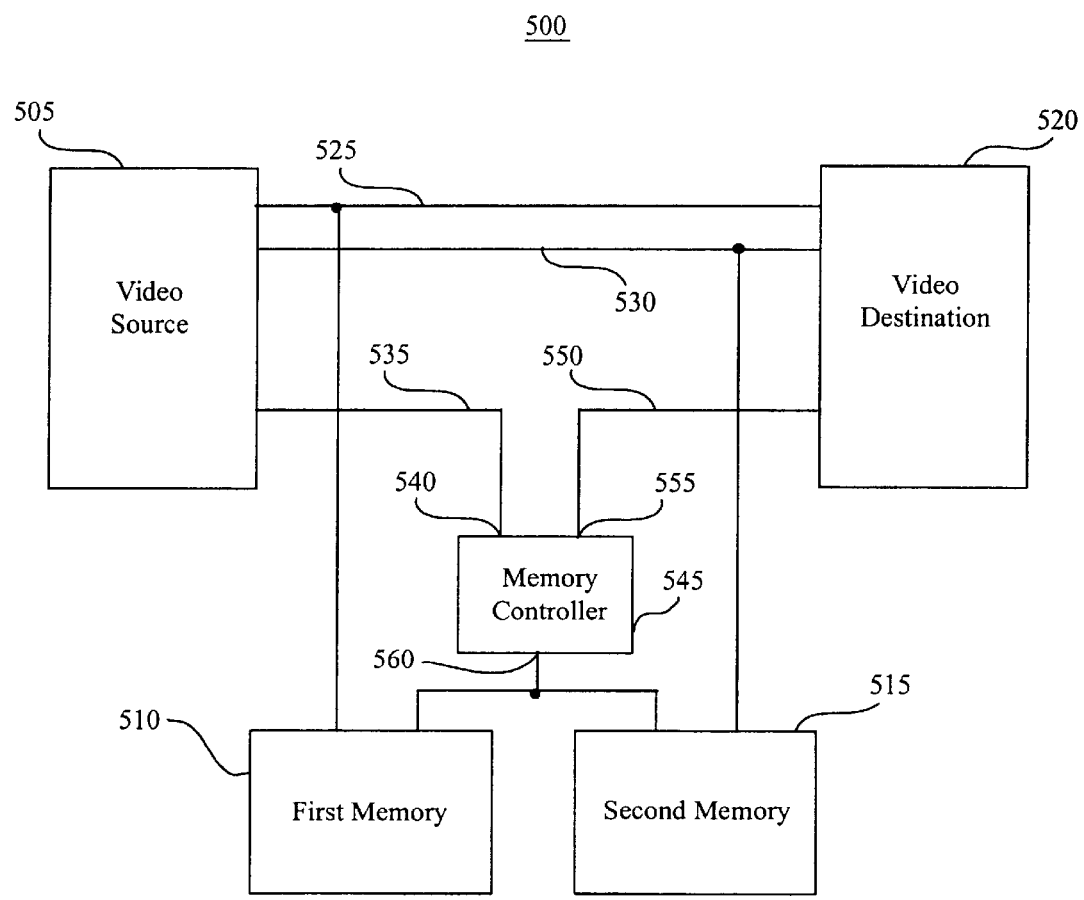
FIG. 5 is a block diagram of another implementation of a dual pixel frame buffer architecture.
Figure 6A:
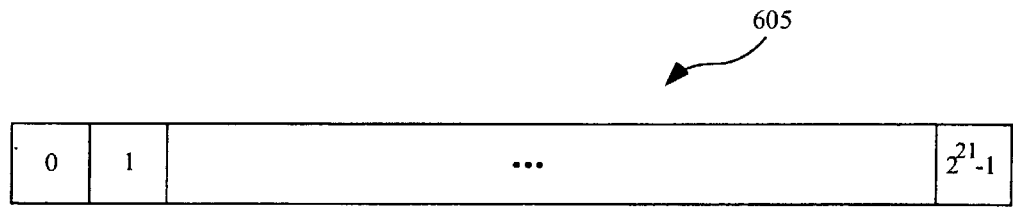
FIG. 6A is a representation of 2,097,152 memory locations as a one-dimensional array.
Figure 6B:
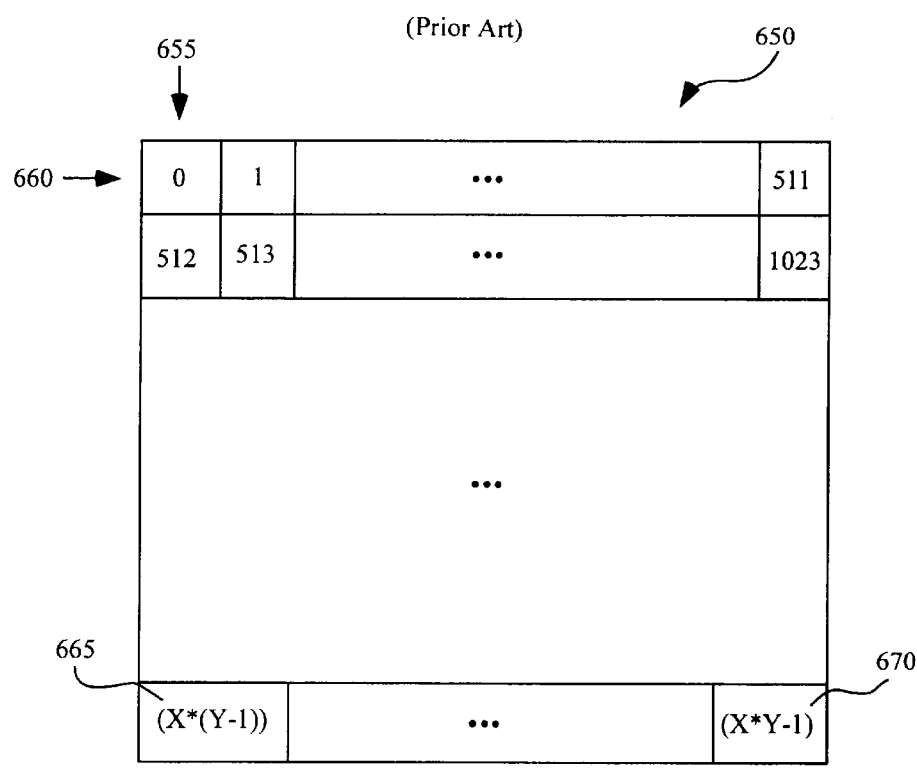
FIG. 6B is a representation of 2,097,152 memory locations as a two-dimensional array or grid.
Figure 6C:
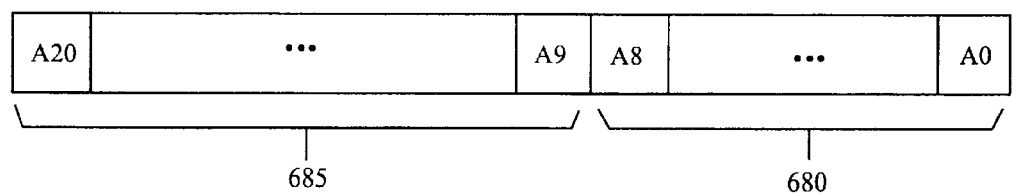
FIG. 6C is a representation of an address for one memory location out of 2,097,152.
Figure 12:
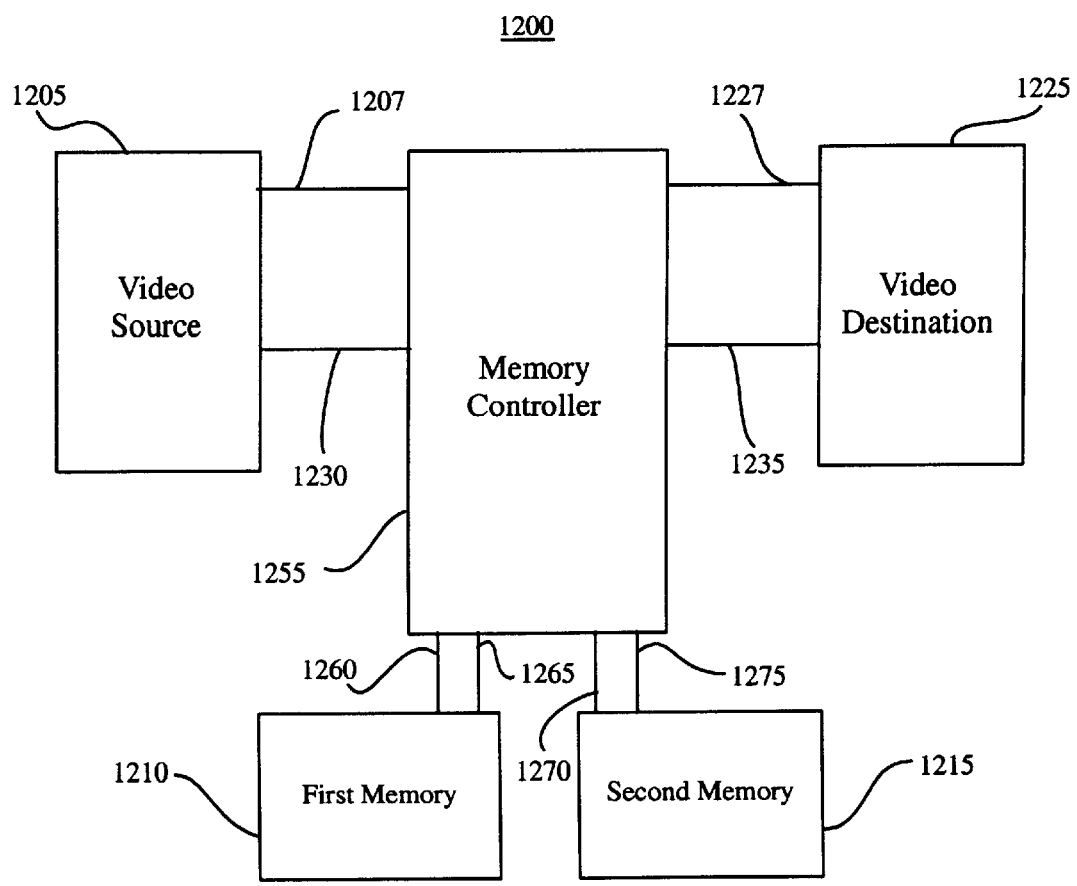
FIG. 12 is a block diagram of a frame buffer architecture according to the present invention.

FIG. 12 is a block diagram of a frame buffer architecture 1200. Architecture 1200 is similar to architectures 400 and 500 in FIGS. 4 and 5, respectively, however, architecture 1200 includes a memory controller 1255 centrally interconnecting video source 1205, video destination 1225, first memory 1210 and second memory 1215.

In addition, while memories 1210 and 1215 are used in parallel, pixel data is stored to one memory while pixel data is retrieved from the other memory, as described below. Pixel data can be stored in one memory device and, during the same clock cycle, pixel data can be retrieved from the other memory device. The memory devices switch roles with each frame. This pattern of alternately storing and retrieving is referred to herein as memory alternation. For example, a first frame of pixel data is stored, one pixel at a time, in first memory 1210, as described below. A second frame of pixel data is then stored, one pixel at a time, in second memory 1215. While the second frame is being stored, the first frame of pixel data is retrieved from first memory 1210, one pixel at a time, as described below. Accordingly, pixel data for the first frame is retrieved at the same time pixel data for the second frame is stored (i.e., during the same clock cycle). During every clock cycle, pixel data for one frame is stored and pixel data previously stored is retrieved. For the next frames, the memory devices switch roles. The third frame of pixel data is stored in first memory 1210, while the second frame of pixel data is retrieved from second memory 1215. Memory alternation continues as long as frames are supplied to video source 1205.

A video source 1205 provides pixel data to memory controller 1255 and a video destination 1225 retrieves pixel data from memory controller 1255. Using memory alternation, memory controller 1255 stores and retrieves pixel data to and from memories 1210, 1215. First memory 1210 and second memory 1215 are separate memory devices, such as two 32-bit wide 8 MB SDRAM's (e.g., 2M×32 SDRAM MT48LC2M32B2 by Micron Technology, Inc.). The SDRAM is preferably fast enough to support the data rate needed for the screen resolution, such as 150 MHz or 166 MHz. Other types of memory can also be used, such as SGRAM (synchronous graphics RAM).

Video source 1205 receives video data from another source (not shown), such as a broadcast source or a software application running on a computer system connected to video source 1205. Video source 1205 outputs pixel data for one pixel at a time on first data bus 1207.

Video destination 1225 provides pixel data to a display system (not shown in FIG. 12), such as data destination 1115 in FIG. 11 implemented as a GLV system. Video destination 1225 receives pixel data for one pixel at a time on a second data bus 1227. In one implementation, video source 1205 and video destination 1225 include FIFO buffers, such as to avoid buffer overrun or underrun. In another implementation, these FIFO buffers are included in memory controller 1255.

First data bus 1207 is connected to video source 1205 and memory controller 1255. Second data bus 1227 is connected to video destination 1225 and memory controller 1255. Memory controller 1255 receives signals from video source 1205 and video destination 1225 through control lines 1230 and 1235, respectively, for addressing (e.g., indicating whether pixel data is to be stored to or retrieved from memories 1210 and 1215), or that horizontal and vertical synchronization signals have been received (e.g., to indicate the end of a frame row of pixels or the end of a frame, respectively). A first memory data bus 1260 and a first memory address bus 1265 are connected to memory controller 1255 and first memory 1210. A second memory data bus 1270 and a second memory address bus 1275 are connected to memory controller 1255 and second memory 1215. First memory 1210 and second memory 1215 also receive control signals (not shown) from memory controller 1255 to control whether memories 1210 and 1215 will read in data (write mode) or read out data (read mode). In addition, while clock lines are not shown in FIG. 12, architecture 1200 operates based on clock cycles so that pixel data can be processed for two pixels per clock cycle in support of the desired pixel rate.

Memory controller 1255 controls routing pixel data from video source 1205 to memories 1210 and 1215 and routing pixel data from memories 1210 and 1215 to video destination 1225. Memory controller 1255 controls the operation of memories 1210 and 1215, such as the read or write state, and also generates addresses for storing pixel data to and retrieving data from memories 1210 and 1215, as described below. In an alternative implementation, separate address generators for storing and retrieving data provide addresses to memory controller 1255. In another alternative implementation, a separate memory controller is provided for and connected to each memory and generates addresses for the connected memory.

Memory controller 1255 operates to provide the mapping of pixel pages from pixels to memory locations and to control the alternation between storing and retrieving data for memories 1210 and 1215. In aspects other than pixel pages and alternation of storing and retrieving, such as generating addresses, architecture 1200 operates similarly to dual pixel architectures 400 and 500, as described above. In alternative implementations, an architecture structurally similar to architecture 400 or architecture 500 can be used (e.g., an architecture including address multiplexors and having address generation controlled by video source and video destination), with modifications as described below.

Memory controller 1255 has two states: (A) connecting first data bus 1207 to first memory 1210, and second data bus 1227 to second memory 1215; and (B) connecting first data bus 1207 to second memory 1215, and second data bus 1227 to first memory 1210. Accordingly, in state A while first memory data bus 1260 is providing pixel data to be stored to first memory 1210, second memory data bus 1270 is providing pixel data retrieved from second memory 1215. Conversely, in state B while first memory data bus 1260 is providing pixel data retrieved from first memory 1210, second memory data bus 1270 is providing pixel data to be stored to second memory 1215. The memory that memory controller 1255 currently uses for storing pixel data is referred to herein as the store memory, and the memory that memory controller 1255 currently uses for retrieving pixel data is referred to herein as the retrieve memory. Memory controller 1255 receives a control signal to switch between states, such as from video source 1205 on control line 1230. Video source 1205 toggles the control signal after completing storing pixel data for a frame. In one implementation, memory controller 1255 is connected to a flip-flop that is triggered by a vertical synchronization signal supplied by video source 1205.

Figure 13:
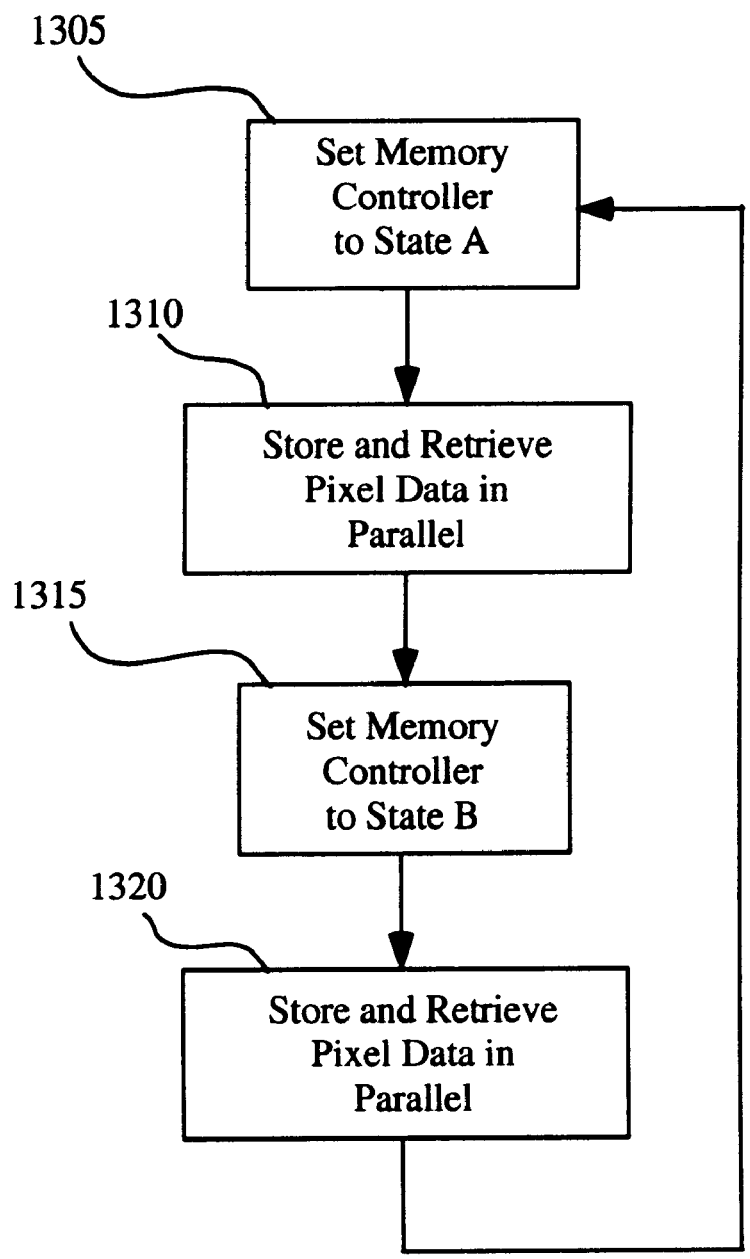
FIG. 13 is a flowchart of storing and retrieving pixel data in parallel using memory alternation according to the present invention.

FIG. 13 is a flowchart of storing and retrieving pixel data in parallel using memory alternation, such as in architecture 1200 of FIG. 12. When a first frame of pixel data becomes available to video source 1205, video source 1205 sets memory controller 1255 to state A (pixel data to be stored to first memory 1210, pixel data to be retrieved from second memory 1215), block 1305. Memory controller 1255 stores the first frame of pixel data, one pixel at a time, in first memory 1210, as described below, and memory controller 1255 retrieves pixel data from second memory 1215, as described below, block 1310. Initially, pixel data has not been stored in second memory 1215, and so pixel data retrieved during the first loop may not produce a desirable image. After a frame of pixel data has been stored, video source 1205 sets memory controller 1255 to state B (pixel data to be retrieved from first memory 1210, pixel data to be stored to second memory 1215), block 1315. Memory controller 1255 stores a frame of pixel data and retrieves pixel data for another frame according to the state of memory controller 1255, block 1320. After a frame of pixel data has been stored, video source 1205 returns to block 1305 and sets memory controller 1255 to state A. When a new frame is not available to video source 1205, storing and retrieving pixel data is complete. When a new frame later becomes available, video source 1205 begins at block 1305 again.

As described above, an HD resolution frame has 2,073,600 pixels, in 1920 frame columns and 1080 frame rows. One implementation uses pixel pages having a pixel page geometry of 16×16, such as pixel pages 805 in FIG. 8. A 1920×1080 frame of pixels has 8160 pixel pages 805 allocated, 120 pixel pages 805 horizontally and 68 pixel pages 805 vertically (though the pixel pages 805 in the 68$^{th}$ row of pixel pages 805 are not completely filled with valid screen pixels). Each allocated pixel page has a corresponding memory page and is mapped to a memory page using combined addressing as described above and shown in table 1000 in FIG. 10. Pixel data is stored and retrieved in similar sequences to those described above. Pixel data is stored along horizontal frame rows, such as this sequence of pixels: 0, 1, 2, 3, 4, and so on. Pixel data is retrieved along vertical frame columns, such as this sequence of pixels, 0, 1920, 3840, 5760, and so on.

Memory controller 1255 stores pixel data according to horizontal rows of pixels. Memory controller 1255 controls address generation to map pixel data to memory locations according to a desired pixel page geometry. Memory controller 1255 generates source addresses to store pixel data for one pixel at a time, in parallel with retrieving pixel data for a different pixel, as described below. In an HD resolution implementation, memory controller 1255 stores pixel data for pixels in this sequence: 0, 1, 2, 3, 4, 5, and so on. Referring to FIG. 10, memory controller 1255 generates addresses in the following sequence: 0, 1, . . . , 15, 256, 257, . . . , 271, 512, . . . , 30479, 16, 17, . . . , 2226047 (last pixel in the overlapping section, referring to FIG. 9), 30720 (first pixel in the non-overlapping section), 30721, . . . , 30735, 30976, 30977, . . . , 30991, and so on. This address sequence for storing pixel data can be seen from the description below of the operation of combined addressing in this implementation. As described above, pixel data for pixels in different pixel pages is stored in different memory pages.

Figure 14:
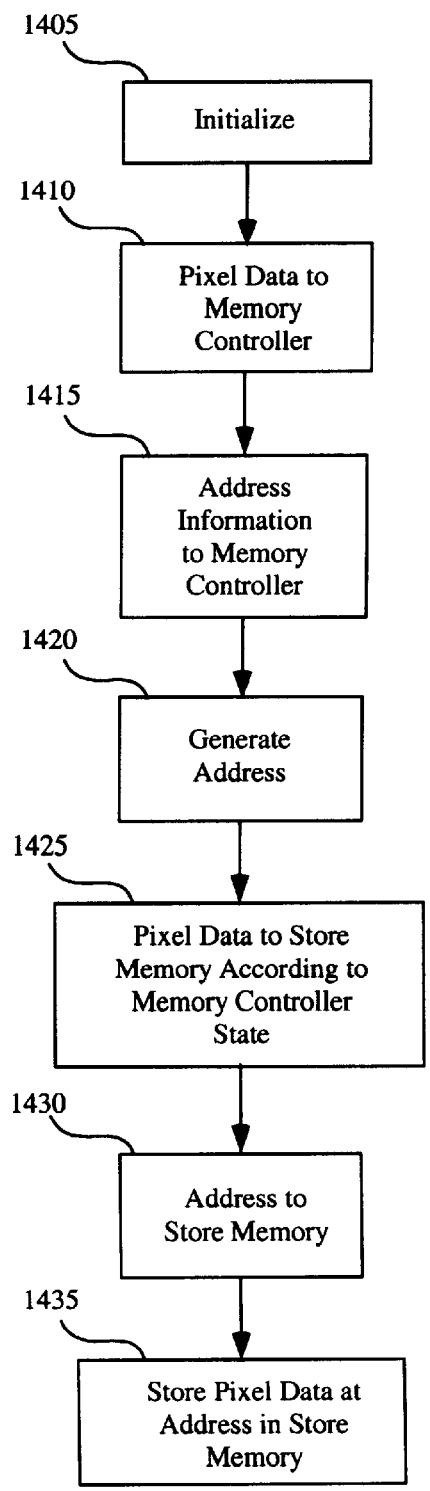
FIG. 14 is a flowchart of storing pixel according to the present invention.

FIG. 14 is a flowchart of storing pixel data using architecture 1200 in FIG. 12. To store pixel data, one of memories 1210, 1215 is the store memory according to the state of memory controller 1255 for memory alternation, as described above. Memory controller 1255 puts the store memory in write mode and memory controller 1255 is set to provide pixel data from video source 1205 to the store memory, block 1405. Video source 1205 provides pixel data for a first pixel to memory controller 1255 through data bus 1207, block 1410. Video source 1205 also provides address information to memory controller 1255 through control line 1230, block 1415. The address information indicates that memory controller 1255 is to store data to one of memories 1210, 1215, such as by indicating whether a frame has ended. Alternatively, video source 1205 provides the address information to memory controller 1255 once at the beginning of storage, such as at block 1405. Memory controller 1255 generates a source address, as described below, to store the pixel data, block 1420. In alternative implementations, video source 1205 can generate the addresses for storing pixel data and pass the addresses to memory controller 1255.

Memory controller 1255 passes the data from data bus 1207 to the store memory through the respective memory data bus (i.e., memory data bus 1260 for memory 1210 or memory data bus 1270 for memory 1215), block 1425. Memory controller 1255 provides the address to the store memory through the respective memory address bus (i.e., memory address bus 1265 for memory 1210 or memory address bus 1275 for memory 1215), block 1430. The store memory stores the pixel data on the connected memory data bus at the address on the connected memory address bus, block 1435. To store pixel data for the next pixel, video source 1205 returns to block 1410, or to block 1405 to restore the state of architecture 1200 for storage.

In one implementation, memory controller 1255 includes a store row counter and a store column counter. Memory controller 1255 increments the store row counter according to frame rows and increments the store column counter based on frame columns and memory allocation. Memory controller 1255 uses combined addressing to generate addresses according to where a pixel is located within the frame. For pixel data for pixels in frame rows 0–1023 (first pixel page section 915 in FIG. 9), memory controller 1255 generates a bit-field address for storing the pixel data by swapping the bit fields of the store row counter and store column counters. For pixel data for pixels in frame rows 1024–1079 (second pixel page section 920 in FIG. 9), memory controller 1255 generates a look-up-table address (LUT address) for storing the pixel data using the store row counter and store column counter as indexes into a look-up-table of addresses.

Figure 15:
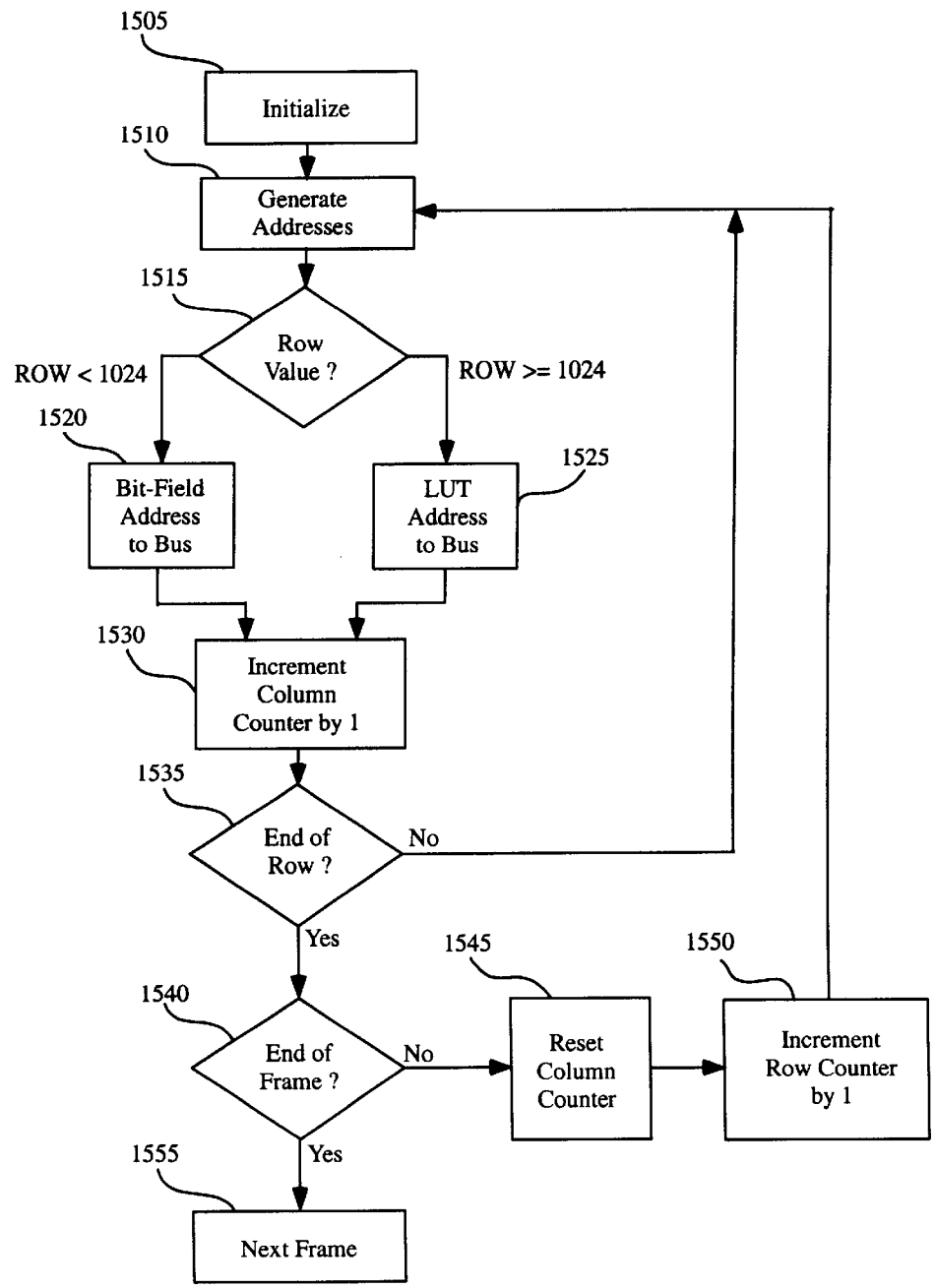
FIG. 15 is a flowchart of generating addresses for storing pixel data according to the present invention.

FIG. 15 is a flowchart of generating addresses for storing pixel data for a frame of pixels in an HD resolution implementation using architecture 1200 in FIG. 12. At the beginning of a frame, memory controller 1255 resets the store row counter and the store column counter to 0, block 1505. Memory controller 1255 generates a bit-field address and a LUT address based on the values of the store row counter and the store column counter, as described below, block 1510. Memory controller 1255 generates both addresses in parallel for pixel data for each pixel and provides one address to the store memory.

Memory controller 1255 evaluates the value of the store row counter, block 1515. In one implementation, memory controller 1255 evaluates the 11$^{th}$ bit of the store row counter (R10 in FIG. 16 below) or uses this bit as a selection control. If the 11$^{th}$ bit is a 0 the store row counter is less than 1024, and if the 11$^{th}$ bit is a 1 the store row counter is equal to or greater than 1024. As described above referring to FIG. 9, if the store row counter is less than 1024, the current pixel is within first pixel page section 915 (the overlapping section of the frame and the memory block), otherwise the current pixel is within second pixel page section 920 (the non-overlapping section). If the store row counter is less than 1024, memory controller 1255 provides the bit-field address to the memory bus for the store memory, block 1520. If the store row counter is greater than or equal to 1024, memory controller 1255 provides the LUT address to the memory bus for the store memory, block 1525.

Memory controller 1255 increments the store column counter by 1, block 1530. Memory controller 1255 compares the value of the store column counter to 1920 to check if the last pixel in a horizontal row has been processed, block 1535. If the store column counter is less than 1920, memory controller 1255 returns to block 1510 and generates new addresses. If the store column counter equals 1920, memory controller 1255 compares the value of the store row counter to 1079 to check if the last pixel in the frame has been processed, block 1540. If the store row counter is less than 1079, memory controller 1255 resets the store column counter to 0, block 1545, and increments the store row counter by 1, block 1550. If the store row counter equals 1079, address generation for the current frame is complete and memory controller 1255 prepares for storing pixel data for the next frame of pixels, block 1555. In an alternative implementation, memory controller 1255 receives from video source 1205 a horizontal synchronization signal to indicate the end of a horizontal row of pixels and a vertical synchronization signal to indicate the end of the frame of pixels. When storing pixel data for a new frame, memory controller 1255 starts generating addresses again beginning with block 1505.

Figure 16:
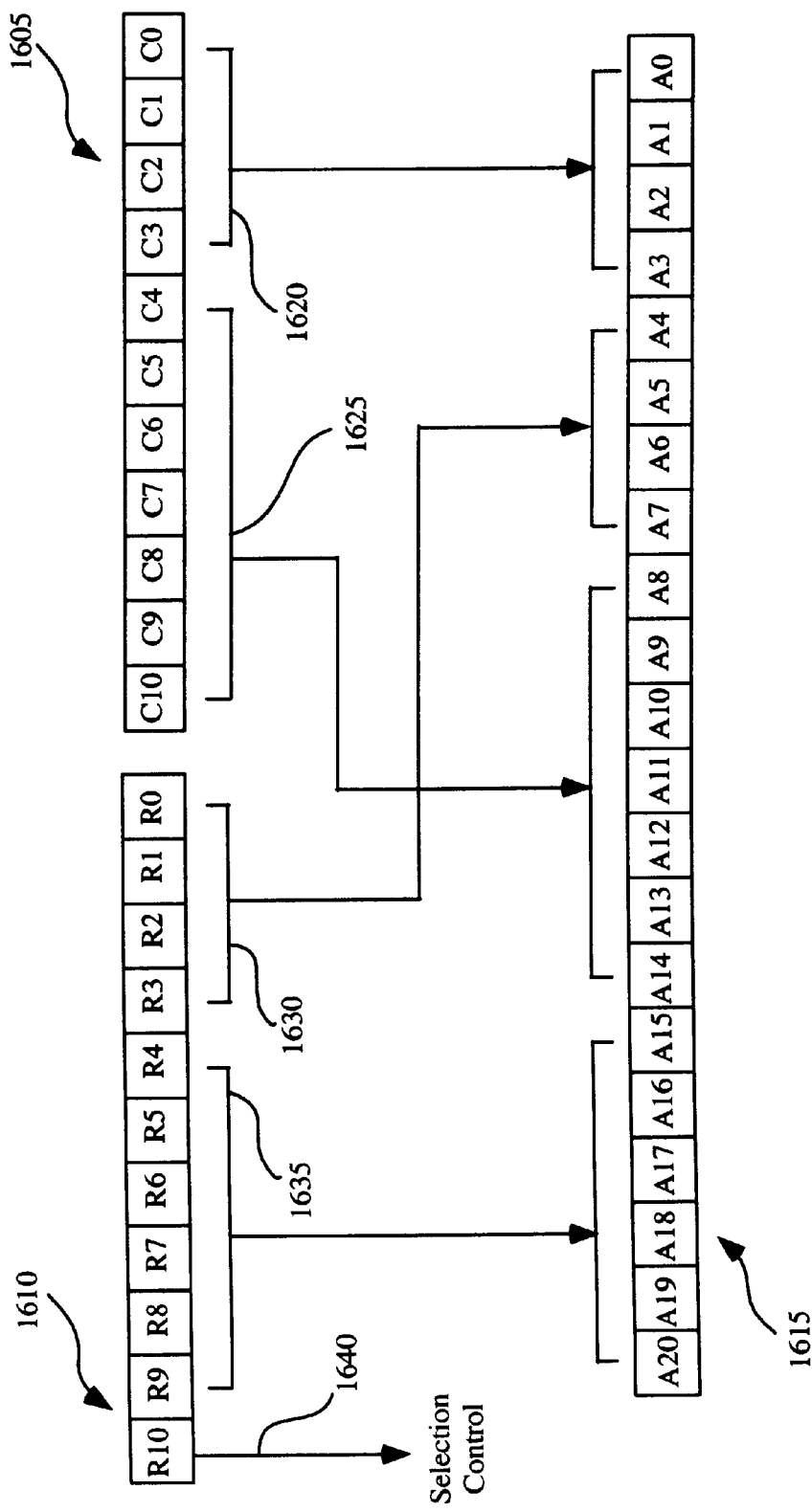
FIG. 16 is a representation of using bits in a store column counter and a store row counter to generate a bit-field address according to the present invention.

FIG. 16 is a representation of using bits in a store column counter 1605 and a store row counter 1610 to generate a bit-field address 1615 in memory controller 1255. The bits of store column counter 1605 and store row counter 1610 are re-ordered to create bit-field address 1615. Store column counter 1605 has 11 bits. Store row counter 1610 has 11 bits. Counters 1605, 1610 are incremented as described above referring to FIG. 15.

The 11 bits of store column counter 1605, numbered C0 through C10 in FIG. 16, indicate a frame column of pixels. The bits of store column counter 1605 are subdivided into two fields: four horizontal pixel bits 1620 (bits C0 through C3), and seven horizontal pixel page bits 1625 (bits C4 through C10). Horizontal pixel bits 1620 indicate one of 16 pixels horizontally in a pixel page row of a pixel page. Horizontal pixel bits 1620 also indicate a pixel page column. Horizontal pixel page bits 1625 indicate one of 120 pixel pages horizontally.

The 11 bits of store row counter 1610, numbered R0 through R10, indicate a frame row of pixels. The bits of store row counter 1610 are subdivided into three fields: four vertical pixel bits 1630 (bits R0 through R3), six vertical pixel page bits 1635 (bits R4 through R9), and a selection bit 1640 (bit R10). Vertical pixel bits 1630 indicate one of 16 pixels vertically in a pixel page column of a pixel page. Vertical pixel bits 1630 also indicate a pixel page row. Vertical pixel page bits 1635 indicate one of 68 pixel pages vertically. As described above, 68 pixel pages can include a column of 1088 pixels, vertically (68*16), so some of the pixel pages will include invalid screen pixels and the corresponding memory locations are not used. When incrementing store row counter 1610, memory controller 1255 increments and sets store row counter 1610 to pass over these unused spaces. For example, store row counter 1610 resets to 0 after the last pixel of the frame, rather than incrementing through $2^{11}-1$. Selection bit 1640 indicates which pixel page section (915 or 920 in FIG. 9) includes the current pixel and so which address to use (the bit-field address or the LUT address), as described above referring to block 1515 of FIG. 15.

To calculate bit-field address 1615 from store column counter 1605 and store row counter 1610, memory controller 1255 stores the bit fields of store column counter 1605 and store row counter 1610 as shown in FIG. 16, such as in a bit-field address register separate from counters 1605, 1610. Bit-field address 1615 has 21 bits, numbered A0 through A20 in FIG. 16. Horizontal pixel bits 1620 (C0–C3) are stored in bits A0–A3 of bit-field address 1615. Vertical pixel bits 1630 (R0–R3) are stored in bits A4–A7. Horizontal pixel page bits 1625 (C4–C10) are stored in bits A8–A14. Vertical pixel page bits 1635 (R4–R9) are stored in bits A15–A20. Selection bit 1640 (bit R10) is not used in bit-field address 1615. Furthermore, bits A0–A7 form a column address and bits A8–A20 form a page address for the store memory. As described above, a GLV typically has 1088 pixels, creating an extra eight rows of pixels, so memory 1210 may store constant data (such as black) for these extra 8 rows of pixels when supplying pixel data to a GLV.

Figure 17:
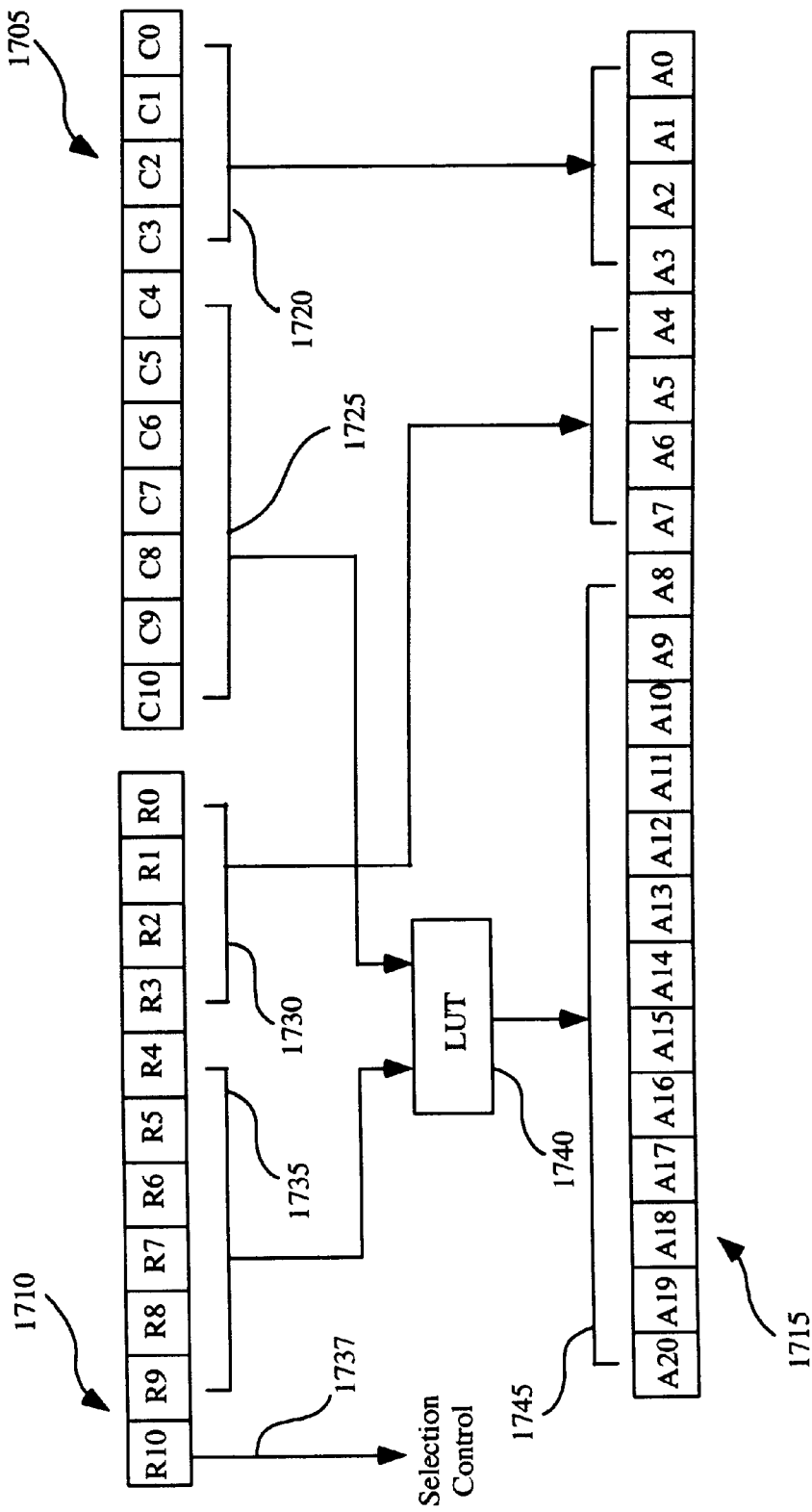
FIG. 17 is a representation of using bits in a store column counter and a store row counter to generate a LUT address according to the present invention.

FIG. 17 is a representation of using bits in a store column counter 1705 and a store row counter 1710 to generate a LUT address 1715 in memory controller 1255. Memory controller 1255 uses some of the bits of store column counter 1705 and store row counter 1710 as indexes into a look-up-table (LUT) and some as part of LUT address 1715. In one implementation, memory controller 1255 uses the same store column counter and store row counter for generating the bit-field address and the LUT address (e.g., counters 1605, 1610 and counters 1705, 1710 are the same counters, respectively). In this case, store column counter 1705 and store row counter 1710 operate as described above referring to FIG. 16 and are sub-divided as described above into five fields: horizontal pixel bits 1720 (C0–C3), horizontal pixel page bits 1725 (C4–C10), vertical pixel bits 1730 (R0–R3), vertical pixel page bits 1735 (R4–R9), and selection bit 1737 (R10).

Memory controller 1255 provides horizontal pixel page bits 1725 and vertical pixel page bits 1735 to an LUT 1740. LUT 1740 uses horizontal pixel page bits 1725 and vertical pixel page bits 1735 as indexes to determine which pixel page includes the pixel for which pixel data is being stored. In one implementation, one or more bits are not used (such as replacing R9 with a 0 value instead of providing R9 to LUT 1740), or are passed through unchanged (such as bits C4–C6). For a pixel page in one of the first 64 horizontal rows of pixel pages (rows 0–63; pixel pages 0–7679), LUT 1740 outputs a constant, such as 0. For a pixel page in one of the last 4 horizontal rows of pixel pages (rows 64–67; pixel pages 7680–8159), LUT 1740 outputs a 13 bit starting address 1745 indicating the starting address of the memory page storing pixel data for that pixel page. In one implementation, LUT 1740 uses selection bit 1737 (R10) to determine if the pixel page is in rows 0–63 of pixel pages or rows 64–67 because rows 0–63 include frame rows 0–1023 and rows 64–67 include frame rows 1024–1079. In one implementation, LUT 1740 is hardwired within memory controller 1255 (e.g., using gate logic) to output 0 or a starting address. In an alternative implementation, LUT 1740 uses a memory, such as a ROM or one of memories 1210, 1215.

Memory controller 1255 combines starting address 1745, horizontal pixel bits 1720 (C0–C3), and vertical pixel bits 1730 (R0–R3) to form LUT address 1715 as shown in FIG. 17, such as in a LUT address register. LUT address 1715 has 21 bits, numbered A0 through A20 in FIG. 17. Horizontal pixel bits 1720 (C0–C3) are stored in bits A0–A3 of bit-field address 1715. Vertical pixel bits 1730 (R0–R3) are stored in bits A4–A7. Starting address 1745 is stored in bits A8–A20. As with bit-field address 1615 in FIG. 16, bits A0–A7 form a column address and bits A8–A20 form a page address for the store memory.

Memory controller 1255 retrieves pixel data according to vertical columns of pixels. Memory controller 1255 generates destination addresses to retrieve pixel data for one pixel at a time, in parallel with storing pixel data for a different pixel, as described above. In an HD resolution implementation, memory controller 1255 retrieves pixel data for pixels in this sequence: 0, 1920, 3840, and so on. Referring to FIG. 10, memory controller 1255 generates addresses in the following sequence: 0, 16, . . . , 240, 32768, . . . , 2064128 (last pixel in the first column in the overlapping section), 30720, 30736, . . . , 1474560 (last pixel in the first column), 1, 17, . . . , and so on. This address sequence for retrieving pixel data can be seen from the description below of the operation of combined addressing in this implementation. As described above, pixel data for pixels in different pixel pages is retrieved from different memory pages.

Figure 18:
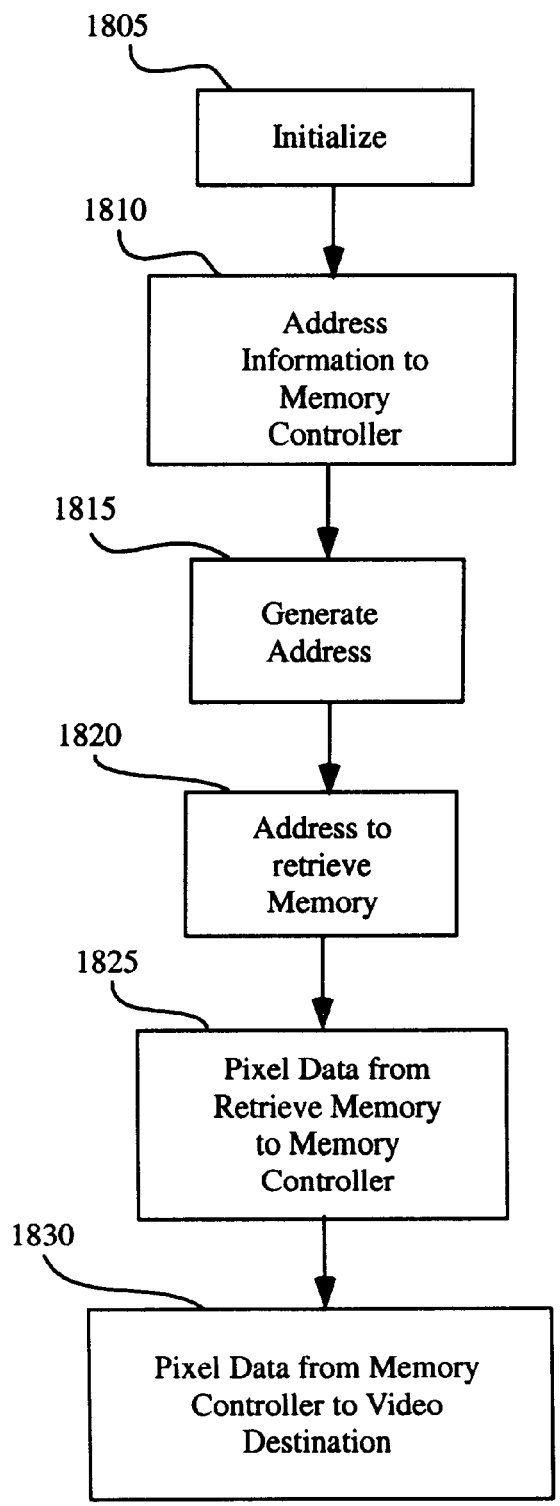
FIG. 18 is a flowchart of retrieving pixel data according to the present invention.

FIG. 18 is a flowchart of retrieving pixel data. To retrieve pixel data, one of memories 1210, 1215 is the retrieve memory according to the state of memory controller 1255 for memory alternation, as described above. Memory controller 1255 puts the retrieve memory in read mode and memory controller 1255 is set to provide pixel data from the retrieve memory to video destination 1225, block 1805. Video destination 1225 provides address information to memory controller 1255 through control line 1235, block 1810. The address information indicates that memory controller 1255 is to read data from one of memories 1210, 1215, such as by indicating whether a frame has been completely retrieved. Alternatively, video destination 1225 provides the address information to memory controller 1255 once at the beginning of retrieval, such as at block 1805. Memory controller 1255 generates a destination address as described below to retrieve the pixel data, block 1815. In alternative implementations, video destination 1225 can generate the addresses for retrieving pixel data and pass the addresses to memory controller 1255.

Memory controller 1255 provides the destination address to the retrieve memory through the respective memory address bus (i.e., memory address bus 1265 for memory 1210 or memory address bus 1275 for memory 1215), block 1820. The retrieve memory provides the pixel data stored at the address on the connected memory address bus to memory controller 1255 through the connected memory data bus (i.e., memory data bus 1260 for memory 1210 or memory data bus 1270 for memory 1215), block 1825. Memory controller 1255 provides the pixel data from the retrieve memory to video destination 1225 through data bus 1227, block 1830. To retrieve pixel data for the next pixel, video destination returns to block 1810, or to block 1805 to restore the state of architecture 1200 for retrieval.

In one implementation, memory controller 1255 includes a retrieve row counter and a retrieve column counter. The retrieve row counter and retrieve column counter are used similarly to the store row counter and store column counter described above. Memory controller 1255 increments the retrieve row counter according to frame rows and increments the retrieve column counter based on frame columns and memory allocation. Memory controller 1255 uses combined addressing to generate addresses according to where a pixel is located within the frame. For pixel data for pixels in frame rows 0–1023 (first pixel page section 915 in FIG. 9), memory controller 1255 generates a bit-field address for retrieving the pixel data by swapping the bit fields of the retrieve row counter and retrieve column counter. For pixel data for pixels in frame rows 1024–1079 (second pixel page section 920 in FIG. 9), memory controller 1255 generates a look-up-table address (LUT address) for retrieving the pixel data using the retrieve row counter and retrieve column counter as indexes into a look-up-table of addresses.

Figure 19:
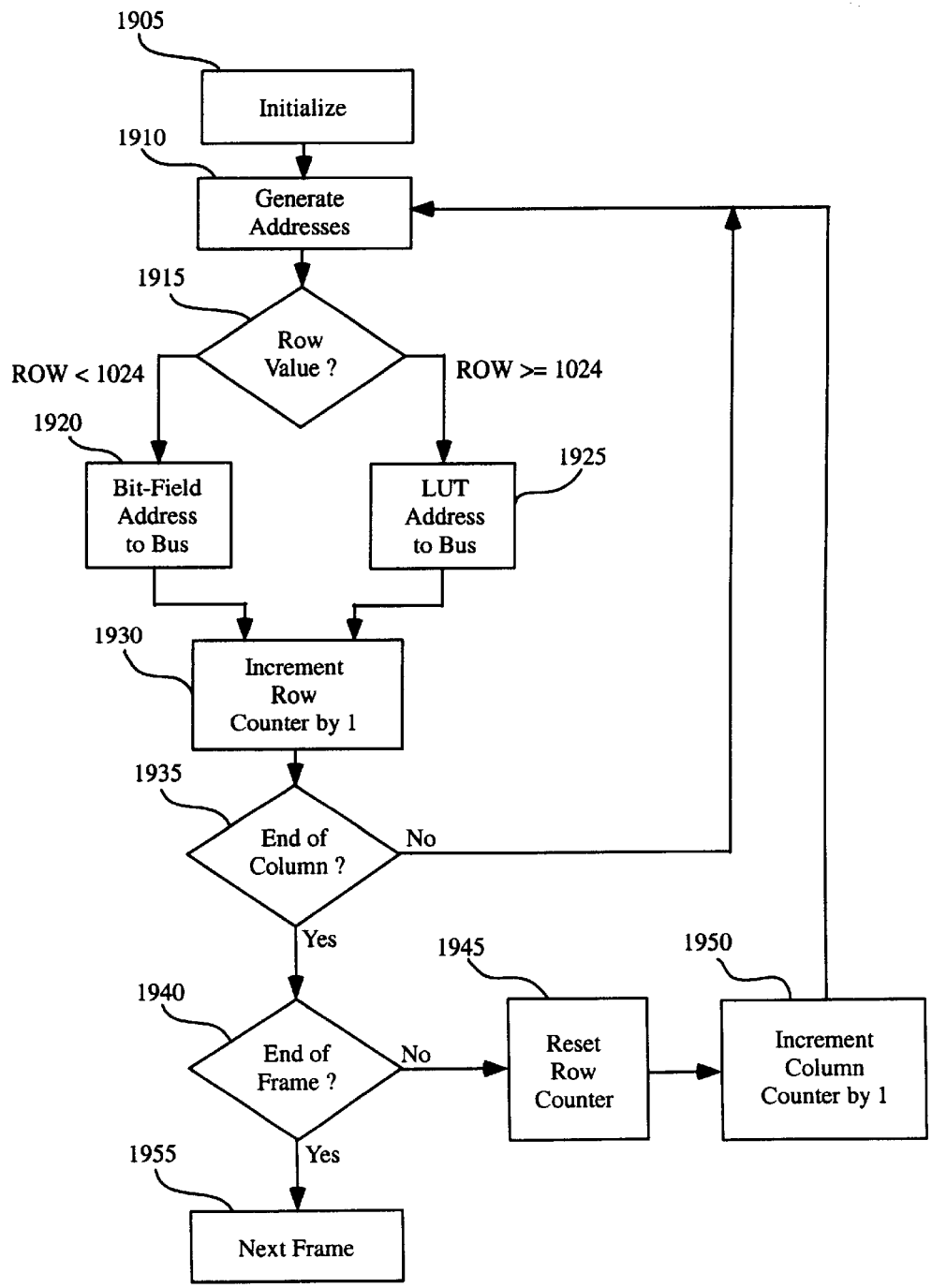
FIG. 19 is a flowchart of generating addresses for retrieving pixel data according to the present invention.

FIG. 19 is a flowchart of generating addresses for retrieving pixel data for a frame of pixels in an HD resolution implementation using architecture 1200 in FIG. 12. At the beginning of a frame, memory controller 1255 resets the retrieve row counter and the retrieve column counter to 0, block 1905. Memory controller 1255 generates a bit-field address and a LUT address based on the values of the retrieve row counter and the retrieve column counter, as described below, block 1910. Memory controller 1255 generates both addresses in parallel for pixel data for each pixel and provides one address to the retrieve memory.

Memory controller 1255 evaluates the value of the retrieve row counter, block 1915. In one implementation, memory controller 1255 evaluates the $11^{th}$ bit of the retrieve row counter or uses this bit as a selection control (recalling selection bit 1640 or 1737 (R10) described above referring to FIGS. 16 and 17, respectively). If the $11^{th}$ bit is a 0 the retrieve row counter is less than 1024, and if the $11^{th}$ bit is a 1 the retrieve row counter is equal to or greater than 1024. As described above referring to FIG. 9, if the retrieve row counter is less than 1024, the current pixel is within first pixel page section 915 (the overlapping section of the frame and the memory block), otherwise the current pixel is within second pixel page section 920 (the non-overlapping section). If the retrieve row counter is less than 1024, memory controller 1255 provides the bit-field address to the memory bus for the retrieve memory, block 1920. If the retrieve row counter is greater than or equal to 1024, memory controller 1255 provides the LUT address to the memory bus for the retrieve memory, block 1925.

Memory controller 1255 increments the retrieve row counter by 1, block 1930. Memory controller 1255 compares the value of the retrieve row counter to 1080 to check if the last pixel in a vertical column has been processed, block 1935. If the retrieve row counter is less than 1080, memory controller 1255 returns to block 1910 and generates new addresses. If the retrieve row counter equals 1080, memory controller 1255 compares the value of the retrieve column counter to 1919 to check if the last pixel in the frame has been processed, block 1940. If the retrieve column counter is less than 1919, memory controller 1255 resets the retrieve row counter to 0, block 1945, and increments the retrieve column counter by 1, block 1950. If the retrieve column counter equals 1919, address generation for the current frame is complete and memory controller 1255 prepares for retrieving pixel data for the next frame of pixels, block 1955. When retrieving pixel data for a new frame, memory controller 1255 starts generating addresses again beginning with block 1905.

Memory controller 1255 generates bit-field addresses and LUT addresses using the retrieve row counter and retrieve column counter in the same way as described above for generating addresses using the store row counter and store column counter referring to FIGS. 16 and 17. Memory controller 1255 stores and retrieves pixel data in parallel so uses independent store and retrieve counters. In addition, the address sequences for storing and retrieving pixel data are different and so the store and retrieve counters are incremented differently. However, deriving the bit-field addresses and LUT addresses from the store and retrieve counters is the same.

Various illustrative implementations of the present invention have been described. The above description focuses on HD resolution video data displayed using a GLV system, but the methods and apparatus can be applied to different resolutions. Similarly, the pixel data for a pixel is described above as being 32 bits, but different depths are also possible with modification to the size of the addressed memory locations. Implementations based on those described in application Ser. No. 10/051,538, filed Jan. 16, 2002 can also be made, such as ones storing multiple pixels in parallel and retrieving multiple pixels in parallel. Pixel pages using combined addressing can also be used with a checkerboard buffer, as described in application Ser. No. 09/908,295 (filed on Jul. 17, 2001).

The present invention can be implemented in electronic circuitry, computer hardware, software, or in combinations of them. For example, a frame buffer using pixel pages can be implemented in various ways, such as with an FPGA, a hardwired design, a microprocessor architecture, or a combination. However, one of ordinary skill in the art will see that additional implementations are also possible and within the scope of the present invention. Accordingly, the present invention is not limited to only those implementations described above.

What is claimed is:

1. A pixel page system, comprising:
a data source, providing pixel data for pixels in a first order, where each pixel is in a frame of pixels, the frame having horizontal rows of pixels, vertical columns of pixels, a first section of pixels, and a second section of pixels;
a data destination, receiving pixel data for pixels in a second order;
at least one memory device, each memory device having a plurality of memory pages including a plurality of memory locations divided between a first memory page section and a second memory page section, each memory location having an address; and
where pixel data for each pixel corresponds to an entry in one of a plurality of pixel pages, each pixel page having a plurality of pixel page rows each including a plurality of pixels and a plurality of pixel page columns each including a plurality of pixels, and each pixel page corresponds to a respective memory page, and pixels in the first section of pixels are in a first pixel page section and pixels in the second section of pixels are in a second pixel page section,
where pixel data is stored to the memory device in the first order and retrieved from the memory device in the second order, and where each memory page stores pixel data in multiple locations according to the first order and stores pixel data in multiple locations according to the second order,
where pixel data for pixels in the first pixel page section is stored in memory pages in the first memory page section and pixel data for pixels in the second pixel page section is stored in memory pages in the second memory page section,
where at least two consecutive memory pages in the first memory page section are not contiguous, and at least two consecutive memory pages in the second memory page section are not contiguous.

2. The pixel page system of claim 1, where pixel data for pixels in the first pixel page section is stored in memory pages in the first memory page section using a first addressing system, and pixel data for pixels in the second pixel page section is stored in memory pages in the second memory page section using a second addressing system.

3. The pixel page system of claim 2, further comprising a row counter and a column counter, and where the first addressing system manipulates bit-fields from the row counter and the column counter to generate bit-field addresses.

4. The pixel page system of claim 3, where the first addressing system generates 21 bit bit-field addresses with bits numbered A0–A20, and a 21 bit bit-field address includes:

four bits from the column counter as bits A0–A3;
four bits from the row counter as bits A4–A7;
seven bits from the column counter as bits A8–A14; and
six bits from the row counter as bits A15–A20.

5. The pixel page system of claim 2, further comprising a row counter, a column counter, and a look-up-table, where the second addressing system uses bit-fields from the row counter and the column counter as indexes into the look-up-table to generate LUT addresses, and where the look-up-table generates starting addresses.

6. The pixel page system of claim 5, where the look-up-table generates 13 bit starting addresses, where the second addressing system generates 21 bit LUT addresses with bits numbered A0–A20, and where a 21 bit LUT address includes:

four bits from the column counter as bits A0–A3;
four bits from the row counter as bits A4–A7; and
a 13 bit starting address from the look-up-table as bits A8–A20.

7. The pixel page system of claim 5, where the look-up-table is hard-wired to generate a starting address from indexes provided to the look-up-table.

8. The pixel page system of claim 2, where the first addressing system and the second addressing system generate addresses in parallel.

9. The pixel page system of claim 1, where the data destination is connected to a GLV system and provides pixel data to the GLV system.

10. The pixel page system of claim 1, where each pixel page has a pixel page geometry of 16×16.

11. The pixel page system of claim 1, further comprising a memory controller for generating addresses for storing and retrieving pixel data.

12. The pixel page system of claim 11, where the at least one memory device includes a first memory device and a second memory device, and where the memory controller has two states: storing pixel data to the first memory device while retrieving pixel data from the second memory device, and retrieving pixel data from the first memory device while storing pixel data to the second memory device.

13. The pixel page system of claim 12, where the memory controller switches states at the end of storing a frame of pixels.

14. The pixel page system of claim 1, where the at least one memory device includes a first memory device and a second memory device, and where the pixel page system has two states: storing pixel data to the first memory device while retrieving pixel data from the second memory device, and retrieving pixel data from the first memory device while storing pixel data to the second memory device.

15. The pixel page system of claim 14, where the pixel page system switches states at the end of storing a frame of pixels.

16. A method of storing and retrieving pixel data, comprising:

storing pixel data for a first frame of pixels in a first memory device using pixel pages, where the first memory device includes a plurality of memory pages, and at least one memory page stores pixel data for at least two pixels from each of at least two horizontal rows of pixels in the first frame of pixels;
storing pixel data for a second frame of pixels in a second memory device using pixel pages, where the second memory device includes a plurality of memory pages, and at least one memory page stores pixel data for at least two pixels from each of at least two horizontal rows of pixels in the second frame of pixels;

retrieving pixel data for the first frame of pixels from the first memory device using pixel pages; and retrieving pixel data for the second frame of pixels from the second memory device using pixel pages, where pixel data is stored and retrieved using a first addressing system for pixels in a first pixel page section and using a second addressing system for pixels in a second pixel page section.

17. The method of claim 16, where using a first addressing system includes generating a bit-field address having bits numbered A0–A20 for storing and retrieving pixel data for pixels in the first pixel page section using a row counter having bits numbered R0–R10 and a column counter having bits numbered C0–C10, where generating a bit-field address includes:

storing bits C0–C3 as bits A0–A3;

storing bits R0–R3 as bits A4–A7;

storing bits C4–C10 as bits A8–A14; and storing bits R4–R9 as bits A15–A20.

18. The method of claim 16, where using a second addressing system includes generating an LUT address having bits numbered A0–A20 for storing and retrieving pixel data for pixels in the second pixel page section using a row counter having bits numbered R0–R10 and a column counter having bits numbered C0–C10, where generating an LUT address includes:

providing bits C4–C10 as a first index to a look-up-table;

providing bits R4–R9 as a second index to the look-up-table;

generating a 13 bit starting address in the look-up-table according to the first index and the second index, where the starting address generated is the first address in the memory page corresponding to the pixel page in the second pixel page section indicated by the first index and the second index;

storing bits C0–C3 as bits A0–A3;

storing bits R0–R3 as bits A4–A7; and storing the 13 bit starting address as bits A8–A20.

19. The method of claim 16, where storing and retrieving pixel data using a first addressing system for pixels in a first pixel page section and using a second addressing system for pixels in a second pixel page system includes providing an address to a memory by:

generating a first address using the first addressing system;

generating a second address using the first addressing system;

if the pixel for which pixel data is to be stored at the source address being generated is in the first 1024 rows of pixels in the frame of pixels, providing the first address to the memory; and if the pixel for which pixel data is to be stored at the source address being generated is not in the first 1024 rows of pixels in the frame of pixels, providing the second address to the memory.

20. The method of claim 16, further comprising providing retrieved pixel data to a GLV system.

21. The method of claim 16, where each pixel page has a pixel page geometry of 16×16.

22. The method of claim 16, where pixel data is stored to the first memory device while pixel data is retrieved from the second memory device, and pixel data is retrieved from the first memory device while pixel data is stored to the second memory device.

23. The method of claim 16, where the memory devices switch between storing and retrieving with each frame of pixels.

24. A system for storing and retrieving pixel data, comprising:

means for storing, pixel data for a first frame of pixels in a first memory device using pixel pages, where the first memory device includes a plurality of memory pages, and at least one memory page stores pixel data for at least two pixels from each of at least two horizontal rows of pixels in the first frame of pixels;

means for storing pixel data for a second frame of pixels in a second memory device using pixel pages, where the second memory device includes a plurality of memory pages, and at least one memory page stores pixel data for at least two pixels from each of at least two horizontal rows of pixels in the second frame of pixels;

means for retrieving pixel data for the first frame of pixels from the first memory device using pixel pages; and means for retrieving pixel data for the second frame of pixels from the second memory device using pixel pages, where pixel data is stored and retrieved using a first addressing system for pixels in a first pixel page section and using a second addressing system for pixels in a second pixel page section.

* * * * *